US012619007B2

(12) United States Patent
Soci et al.

(10) Patent No.: US 12,619,007 B2
(45) Date of Patent: May 5, 2026

(54) LAYER, AN ELECTRONIC DEVICE, A METHOD OF CONTROLLING SPIN TRANSPORT IN THE LAYER

(71) Applicant: NANYANG TECHNOLOGICAL UNIVERSITY, Singapore (SG)

(72) Inventors: Cesare Soci, Singapore (SG); Giorgio Adamo, Singapore (SG); Mustafa Eginligil, Singapore (SG); Xinxing Sun, Singapore (SG); Harish N.S. Krishnamoorthy, Singapore (SG); Nikolay I. Zheludev, Singapore (SG)

(73) Assignee: Nanyang Technological University, Singapore (SG)

( * ) Notice: Subject to any disclaimer, the term of this patent is extended or adjusted under 35 U.S.C. 154(b) by 568 days.

(21) Appl. No.: 18/041,528

(22) PCT Filed: Aug. 18, 2021

(86) PCT No.: PCT/SG2021/050482
§ 371 (c)(1),
(2) Date: Feb. 13, 2023

(87) PCT Pub. No.: WO2022/039674
PCT Pub. Date: Feb. 24, 2022

(65) Prior Publication Data
US 2023/0305190 A1 Sep. 28, 2023

(30) Foreign Application Priority Data
Aug. 18, 2020 (SG) ............................ 10202007891V

(51) Int. Cl.
*G02B 1/08* (2006.01)
*G01J 1/04* (2006.01)
(Continued)

(52) U.S. Cl.
CPC .............. *G02B 1/08* (2013.01); *G01J 1/0407* (2013.01); *G01J 4/04* (2013.01); *G02B 1/005* (2013.01);
(Continued)

(58) Field of Classification Search
CPC .......... G01J 1/0407; G01J 4/04; G02B 1/002; G02B 1/005; G02B 1/08; G02B 2207/101; H10N 50/20; H10N 50/80
See application file for complete search history.

(56) References Cited

U.S. PATENT DOCUMENTS

2018/0138231 A1 5/2018 Kim et al.

FOREIGN PATENT DOCUMENTS

CN 103247862 A 8/2013

OTHER PUBLICATIONS

Alpichshev et al., "STM Imaging of Electronic Waves on the Surface of Bi2Te3: Topologically Protected Surface States and Hexagonal Warping Effects," *Physical Review Letters 104*(1), 016401, Jan. 2010, 4 pages.
(Continued)

*Primary Examiner* — Mark R Gaworecki
(74) *Attorney, Agent, or Firm* — Seed IP Law Group LLP

(57) ABSTRACT

A layer including a topological insulator, the layer including: an arrangement of a plurality of patterns on a surface of the layer, each pattern of the plurality of patterns including at least a non-straight elongated portion. An electronic device including the layer including a topological insulator, and further including first and second electrodes on the layer. Further, the first and second electrodes may be configured to provide electrical connection to the layer. A method of controlling spin transport in the layer includes a topological insulator, the method including: applying circularly polarized light on the layer; and driving an electronic component
(Continued)

with a photocurrent produced in the layer by the circularly polarized light.

19 Claims, 19 Drawing Sheets

(51) Int. Cl.
| | |
|---|---|
| *G01J 4/04* | (2006.01) |
| *G02B 1/00* | (2006.01) |
| *H10N 50/00* | (2023.01) |
| *H10N 50/20* | (2023.01) |
| *H10N 50/80* | (2023.01) |

(52) U.S. Cl.
CPC ............. *H10N 50/20* (2023.02); *H10N 50/80* (2023.02); *G02B 1/002* (2013.01); *G02B 2207/101* (2013.01)

(56) References Cited

OTHER PUBLICATIONS

Arakane et al., "Tunable Dirac cone in the topological insulator Bi2-xSbxTe3-ySey," *Nature Communications* 3, 636, Jan. 2012, 5 pages.

Cha et al., "Generation, transport and detection of valley-locked spin photocurrent in WSe2-graphene-Bi2Se3 heterostructures," *Nature Nanotechnology* 13(10):910-915, Oct. 2018,.

Chan et al., "Photocurrents in Weyl semimetals," *Physical Review B 95*, 041104, Jan. 2017, 5 pages.

De Juan et al., "Quantized circular photogalvanic effect in Weyl semimetals," *Nature Communications 8*, 15995, Jul. 2017, 7 pages.

Eginligil et al., "Dichroic spin-valley photocurrent in monolayer molybdenum disulphide," *Nature Communications 6*, 7636, Jul. 2015, 7 pages.

Ganichev et al., "Conversion of Spin into Directed Electric Current in Quantum Wells," *Physical Review Letters* 86:4358-4361, May 2001.

Ganichev et al., "Spin photocurrents in quantum wells," *Journal of Physics: Condensed Matter* 15(20):R935-R983, May 2003.

Ganichev et al., "Subnanosecond ellipticity detector for laser radiation," *Applied Physics Letters* 91(9), 091101, Aug. 2007, 4 pages.

Hsieh et al., "A tunable topological insulator in the spin helical Dirac transport regime," *Nature 460*:1101-1105, Aug. 2009.

Hsieh et al., "Observation of Unconventional Quantum Spin Textures in Topological Insulators," *Science* 323(5916):919-922, Feb. 2009.

Hsieh et al., "Selective Probing of Photoinduced Charge and Spin Dynamics in the Bulk and Surface of a Topological Insulator," *Physical Review Letters* 107(7), 077401, Aug. 2011, 5 pages.

Hosur, "Circular photogalvanic effect on topological insulator surfaces: Berry-curvature-dependent response," *Physical Review B 83*, 035309, Jan. 2011, 7 pages.

Huang et al., "Spin injection and helicity control of surface spin photocurrent in a three dimensional topological insulator," *Nature Communications 8*, 15401, May 2017, 8 pages.

International Search Report, mailed Nov. 10, 2021, for International Patent Application No. PCT/SG2021/050482, 4 pages.

Ji et al., "Spatially dispersive circular photogalvanic effect in a Weyl semimetal," *Nature Materials* 18(9):955-963, Sep. 2019.

Junck et al., "Photocurrent response of topological insulator surface states," *Physical Review B 88*, 075144, Aug. 2013, 7 pages.

Kadic et al., "3D metamaterials," *Nature Reviews Physics 1*:198-210, Mar. 2019.

Kastl et al., "Ultrafast helicity control of surface currents in topological insulators with near-unity fidelity," *Nature Communications 6*, 6617, Mar. 2015, 6 pages.

Krishnamoorthy et al., "Infrared dielectric metamaterials from high refractive index chalcogenides," *Nature Communications* 11(1), 1692, Apr. 2020, 6 pages.

Korenev et al., "Dynamic spin polarization by orientation-dependent separation in a ferromagnet-semiconductor hybrid," *Nature Communications 3*, 959, Jul. 2012, 7 pages.

Kuroda et al., "Generation of Transient Photocurrents in the Topological Surface State of Sb2Te3 by Direct Optical Excitation with Midinfrared Pulses," *Physical Review Letters* 116(7), 076801, Feb. 2016, 5 pages.

Li et al., "Room-temperature valleytronic transistor," *Nature Nanotechnology* 15(9):743-750, Sep. 2020.

Liu et al., "Circular photogalvanic spectroscopy of Rashba splitting in 2D hybrid organic-inorganic perovskite multiple quantum wells," *Nature Communications* 11(1), 323, Jan. 2020, 8 pages.

Liu N. et al., "Stereometamaterials," *Nature Photonics 3*:157-162, Feb. 2009.

Luo et al., "Plasmonic Chiral Nanostructures: Chiroptical Effects and Applications," *Advanced Optical Materials* 5(16), 1700040, Jun. 2017, 18 pages.

Ma et al., "Direct optical detection of Weyl fermion chirality in a topological semimetal," *Nature Physics 13*:842-848, May 2017.

Madelung, "Semiconductors: Data Handbook," Springer-Verlag Berlin Heidelberg GmbH, 3rd edition, DOI 10.1007/978-3-642-18865-7, published Nov. 2003, 705 pages.

Matsushita et al., "Thermoelectric properties of 3D topological insulator: Direct observation of topological surface and its gap opened states," *Physical Review Materials* 1(5), 054202, Oct. 2017, 9 pages.

Mciver et al., "Control over topological insulator photocurrents with light polarization," *Nature Nanotechnology* 7:96-100, Feb. 2012.

Okada et al., "Enhanced photogalvanic current in topological insulators via Fermi energy tuning," *Physical Review B 93*(8), 081403(R), Feb. 2016, 4 pages.

Onishi et al., "Instantaneous Photon Drag Currents in Topological Insulators," Preprint at https://arxiv.org/abs/1403.2492, published Mar. 2014, 20 pages.

Ou et al., "Ultraviolet and visible range plasmonics in the topological insulator Bi1.5Sb0.5Te1.8Se1.2," *Nature Communications 5*, 5139, Oct. 2014, 7 pages.

Pan, Y. et al., "Helicity dependent photocurrent in electrically gated (Bi1-xSbx)2Te3 thin films," *Nature Communications 8*, 1037, Oct. 2017, 9 pages.

Panna et al., "Linear-optical access to topological insulator surface states," *Applied Physical Letters* 110(21), 212103, May 2017, 6 pages.

Plum et al., "Extrinsic electromagnetic chirality in metamaterials," *Journal of Optics A: Pure and Applied Optics* 11(7), 074009, May 2009, 8 pages.

Plum et al., "Metamaterials: Optical Activity without Chirality," *Physical Review Letters* 102(11), 113902, Mar. 2009, 4 pages.

Plum et al., "Optical activity in extrinsically chiral metamaterial," *Applied Physics Letters* 93(19), 191911, Nov. 2008, 4 pages.

Raghu et al., "Collective Modes of a Helical Liquid," *Physical Review Letters* 104(11), 116401, Mar. 2010, 4 pages.

Ren et al., "Giant nonlinear optical activity in a plasmonic metamaterial," *Nature Communications 3*, 833, May 2012, 6 pages.

Ren et al., "Optimizing Bi2-xSbxTe3-ySey solid solutions to approach the intrinsic topological insulator regime," *Physical Review B 84*(16), 165311, Oct. 2011, 6 pages.

Rogacheva et al., "Giant Gyrotropy due to Electromagnetic-Field Coupling in a Bilayered Chiral Structure," *Physical Review Letters* 97(17), 177401, Oct. 2006, 4 pages.

Sánchez-Barriga et al., "Photoemission of Bi2Se3 with Circularly Polarized Light: Probe of Spin Polarization or Means for Spin Manipulation?," *Physical Review X 4*(1), 011046, Mar. 2014, 10 pages.

Seifert et al., "Surface State-Dominated Photoconduction and THz Generation in Topological Bi2Te2Se Nanowires," *Nano Letters* 17(2):973-979, Jan. 2017.

Shao et al., "Faraday Rotation Due to Surface States in the Topological Insulator (Bi1-xSbx)2Te3," *Nano Letters* 17(2):980-984, Jan. 2017.

Soifer et al., "Band-Resolved Imaging of Photocurrent in a Topological Insulator," *Physical Review Letters* 122(16), 167401, Apr. 2019, 7 pages.

(56)  References Cited

OTHER PUBLICATIONS

Song et al., "Electron quantum metamaterials in van der Waals heterostructures," *Nature Nanotechnology 13*(11): 986-993, Nov. 2018.

Stockman et al., "Roadmap on plasmonics," *Journal of Optics 20*(4), 043001, Mar. 2018, 45 pages.

Sun et al., "Topological insulator metamaterial with giant circular photogalvanic effect," *Science Advances 7*(14), eabe5748, Apr. 2021, 8 pages.

Wallbank et al., "Tuning the valley and chiral quantum state of Dirac electrons in van der Waals heterostructures," *Science 353*, 575-579, Aug. 2016.

Xia et al., "Indications of surface-dominated transport in single crystalline nanoflake devices of topological insulator Bi1.5Sb0.5Te1.8Se1.2," *Physical Review B 87*(8), 085442, Feb. 2013, 8 pages.

Xia et al., "Surface dominated transport in single crystalline nanoflake devices of topological insulator Bi1.5 Sb0.5 Te1.8 Se1.2," preprint at https://arxiv.org/abs/1203.2997, Mar. 2012, 32 pages.

Xu et al., "Spontaneous gyrotropic electronic order in a transition-metal dichalcogenide," *Nature 578*(7796):545-549, Feb. 2020.

Yang, "Photonic topological metamaterials," thesis submitted to the University of Birmingham for the degree of Doctor of Philosophy, Oct. 2017, 133 pages.

Yazyev et al., "Spin Polarization and Transport of Surface States in the Topological Insulators Bi2Se3 and Bi2Te3 from First Principles," *Physical Review Letters 105*(26), 266806, Dec. 2010, 4 pages.

Yin et al., "Plasmonics of topological insulators at optical frequencies," *NPG Asia Materials 9*, Aug. 2017, 8 pages.

Yu et al., "Helicity-dependent photocurrent of the top and bottom Dirac surface states of epitaxial thin films of three-dimensional topological insulators Sb2Te3," *Physical Review B 100*(23), 235108, Dec. 2019, 9 pages.

Yuan et al., "Generation and electric control of spin-valley-coupled circular photogalvanic current in WSe2," *Nature Nanotechnology 9*(10):851-857, Sep. 2014.

Zhang et al., "Experimental Demonstration of Topological Surface States Protected by Time-Reversal Symmetry," *Physical Review Letters 103*(26), 266803, Dec. 2009, 4 pages.

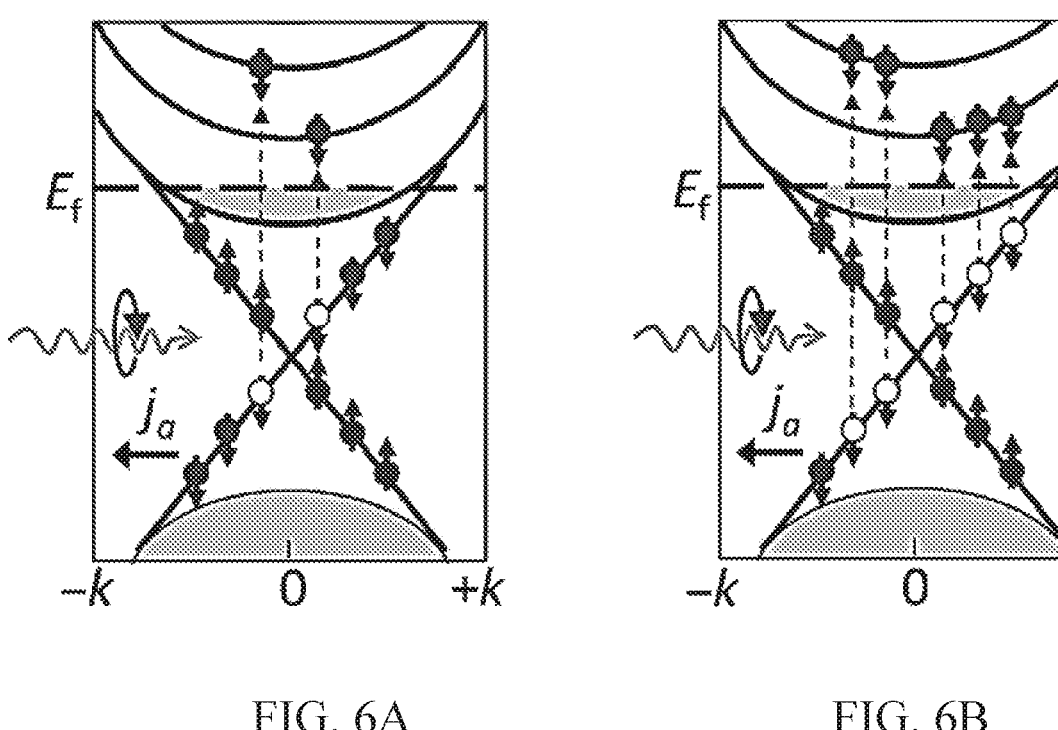
FIG. 6A                          FIG. 6B
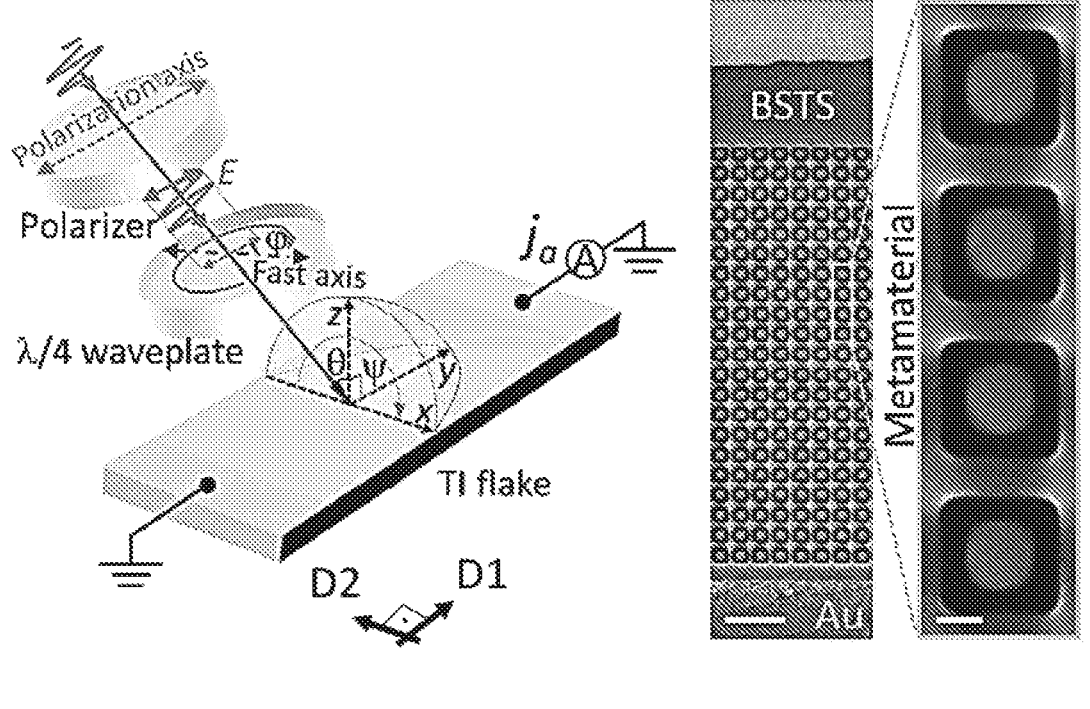
FIG. 6C                          FIG. 6D

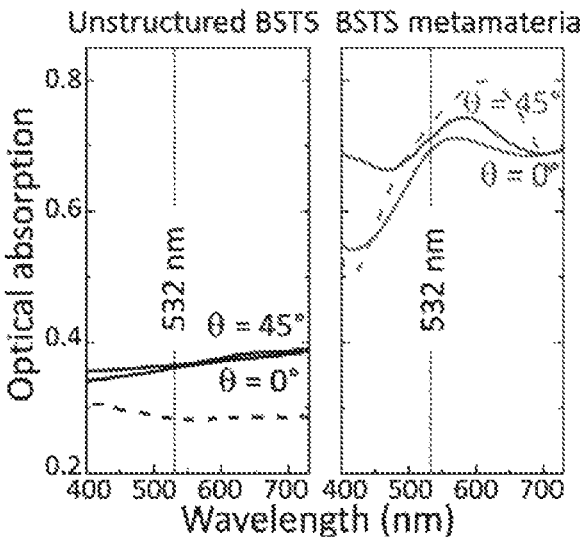
FIG. 7A
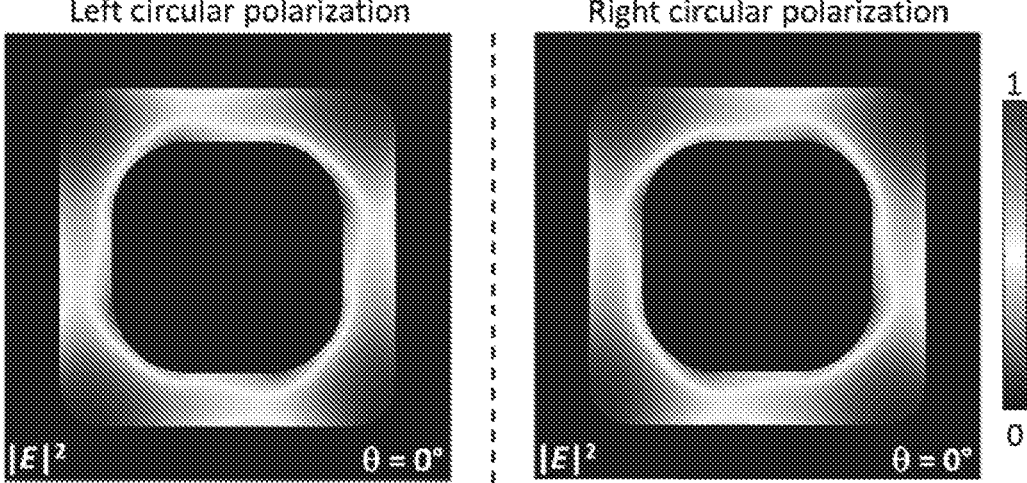
FIG. 7B                    FIG. 7C

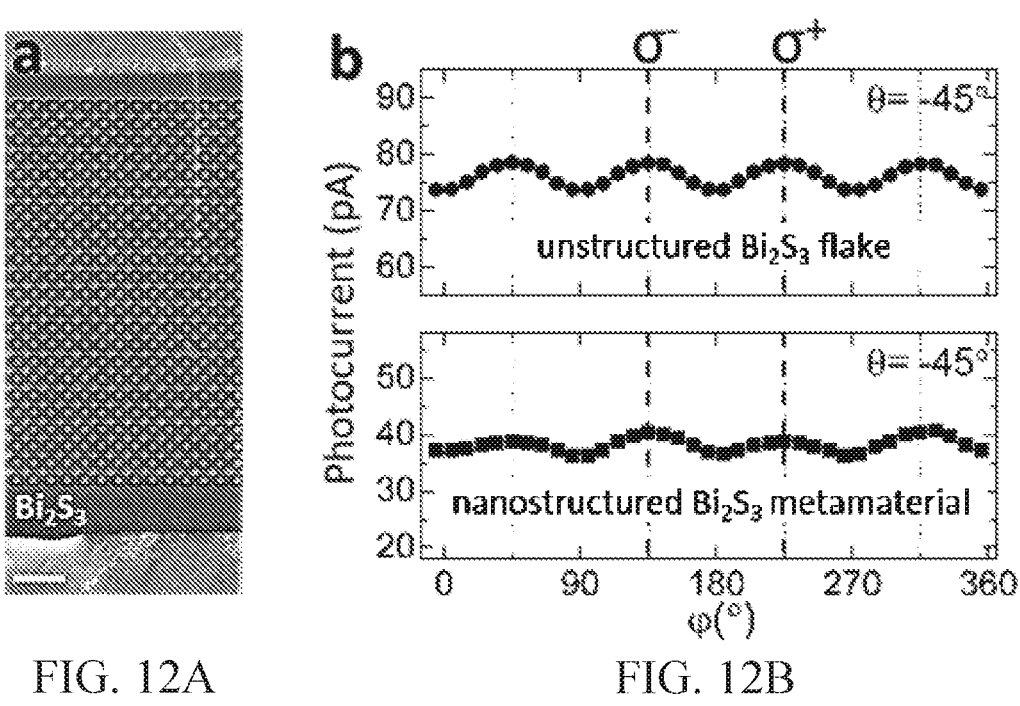
FIG. 12A                              FIG. 12B
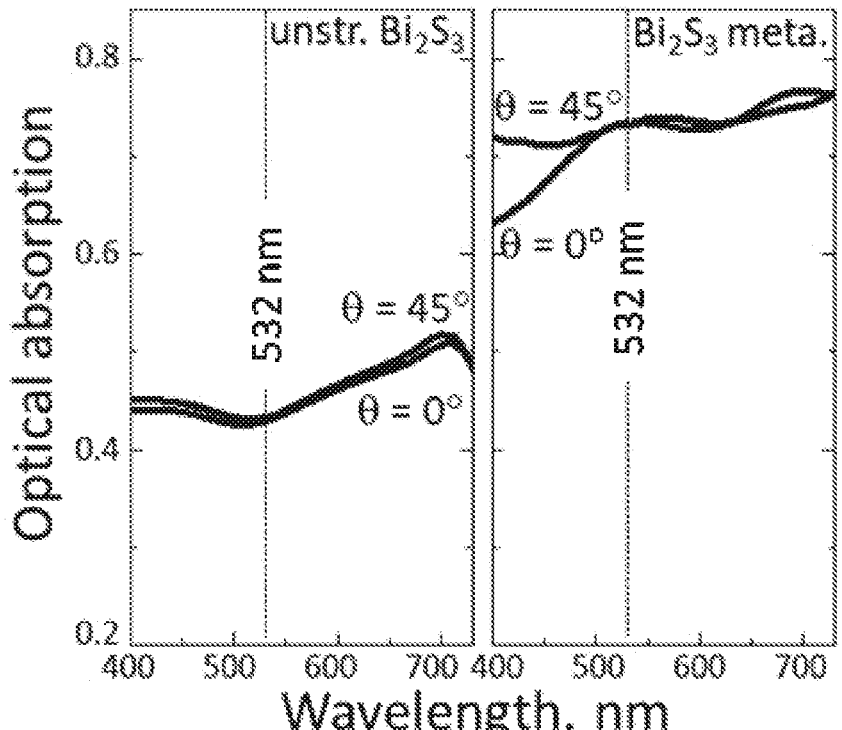
FIG. 13

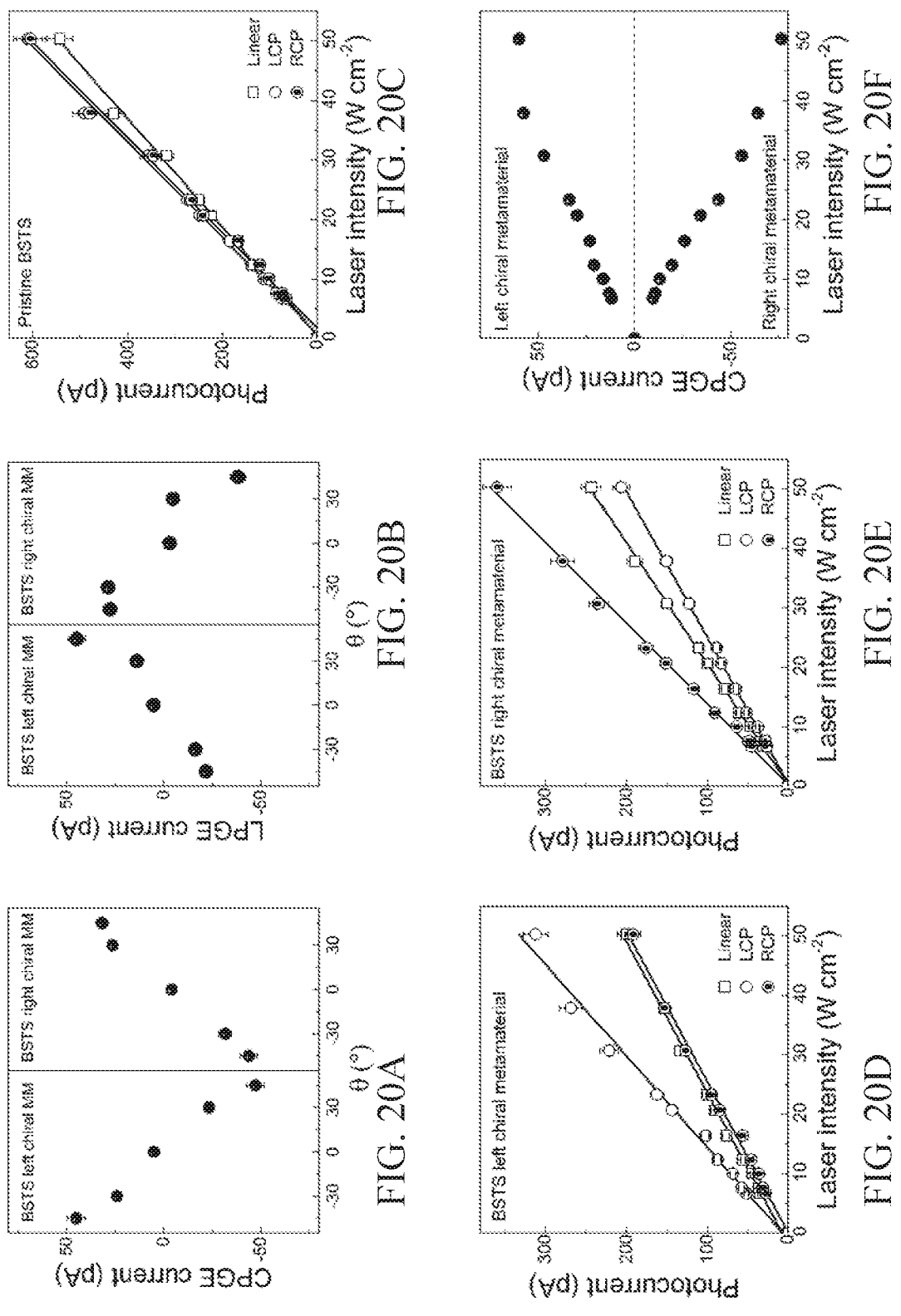

D1

D2

D3

D1

LAYER, AN ELECTRONIC DEVICE, A METHOD OF CONTROLLING SPIN TRANSPORT IN THE LAYER

TECHNICAL FIELD

An aspect of the disclosure relates to a layer. Another aspect of the disclosure relates to an electronic device. Another aspect of the disclosure relates to a method of controlling spin transport in the layer. Another aspect of the disclosure relates to a use of the layer in an electronic device.

BACKGROUND

Photosensors are usually made of semiconductor materials and operate on a junction such as a bipolar pn junction. The photosensors may detect properties of light such as intensity, and, with the use of appropriate filters, may be used to discriminate wavelength and polarization of light. For polarization, a linear or circular polarized sensitive sensor may be produced by using a respective polarizer that only allows the desired polarization through. Polarizers add complexity since it requires a mechanical installation in relation to the semiconductor sensing area, increases the bulkiness of the sensor, and costs. Thus, there is need to provide for improved photosensors.

SUMMARY

An aspect of the disclosure relates to a layer including a topological insulator, the layer including: an arrangement of a plurality of patterns on a surface of the layer, each pattern of the plurality of patterns comprising at least a non-straight elongated portion. The patterns may be formed as a surface relief.

According to various embodiments, the surface may be a first main surface extending in first and second directions, the first and second directions being perpendicular to each other and to a thickness direction of the layer.

According to various embodiments, the patterns may include a pattern portion arranged on a second main surface.

According to various embodiments, each pattern may include a surface recess. Further, a thickness of the pattern may be a depth of the surface recess.

According to various embodiments, each pattern may include a surface protrusion. Further, a thickness of the pattern may be a height of the surface protrusion.

According to various embodiments, each pattern may include uniform thickness along the non-straight elongated portion or along an elongation of the pattern.

According to various embodiments, each pattern may include varying thickness along the non-straight elongated portion or along an elongation of the pattern.

According to various embodiments, each pattern may include a chirality.

According to various embodiments, the chirality may be present under an oblique angle.

According to various embodiments, the chirality may be present under a normal angle.

According to various embodiments, the arrangement may form a lattice, for example, a square lattice.

According to various embodiments, the pattern may include or be an L-shape.

According to various embodiments, the pattern may include or be a square.

According to various embodiments, each pattern may be configured to resonantly increase optical absorption at a resonant wavelength compared to a pattern free and otherwise identical layer.

According to various embodiments, the pattern may be configured to generate a photocurrent which may be depending on a helicity of circularly polarized optical excitation.

According to some embodiments, an absorption and/or a photocurrent of the layer depends on the helicity of circularly polarized optical excitation at oblique angles.

According to some embodiments, an absorption and/or a photocurrent depends on the helicity of circularly polarized optical excitation at normal angle.

According to various embodiments, the topological insulator may include transitional metal chalcogenides.

According to various embodiments, the topological insulator may include Bismuth (Bi), Antimony (Sb), Tellurium (Te), and Selenium (Se).

According to various embodiments, the topological insulator may be $Bi_{1.5}Sb_{0.5}Te_{1.8}Se_{1.2}$ (BSTS).

An aspect of the disclosure relates to an electronic device including a layer including a topological insulator, and further including first and second electrodes on the layer. Further, the first and second electrodes may be configured to provide electrical connection to the layer.

According to various embodiments, the first and second electrodes may be disposed apart from each other on the first main surface of the layer.

According to various embodiments, the layer may be monocrystalline.

An aspect of the disclosure relates to a method of controlling spin transport in the layer including a topological insulator, the method including: applying circularly polarized light on the layer; and driving an electronic component with a photocurrent produced in the layer by the circularly polarized light.

An aspect of the disclosure relates to a topological insulator, as described above, in an electronic device. The electronic device may be selected from: a polarization sensitive photodetector; a spin polarized photodetector; a device for measuring molecular chirality; a quantum optospintronic device for transferring of polarization and entanglement from photons to electron spins.

BRIEF DESCRIPTION OF THE DRAWINGS

The invention will be better understood with reference to the detailed description when considered in conjunction with the non-limiting examples and the accompanying drawings, in which:

FIGS. 6A to 6D are used to explain the theory of the physical mechanism in the layer under circularly polarized light, however the disclosure is not limited to this theory;

FIG. 7A shows measured (dashed lines) and simulated (continuous lines) optical absorption of an unstructured flake and a nanostructured metamaterial in accordance with various embodiments;

FIG. 7B and FIG. 7C show maps of the electric field intensity at 10 nanometers (nm) below the top surface of the metamaterial unit cell at normal incidence, for left (LCP) and right (RCP) circular polarization, respectively;

FIGS. 12A and 12B show a metamaterial device (FIG. 12A) designed to increase absorption at the excitation wavelength of $\lambda=532$ nm (FIG. 12B);

FIG. 13 shows the simulated optical absorption under $\theta=0°$ (left) and $\theta=-45°$ (right), for the unstructured $Bi_2S_3$ and the metamaterial $Bi_2S_3$;

FIGS. 20A and 20B show a dependence of amplitude and direction of CPGE and LPGE photocurrents on angle of incidence, q, for left and right chiral metamaterials;

FIGS. 20C to 20F show photodetector properties of the topological insulator metamaterial;

DETAILED DESCRIPTION

Figure 1A:
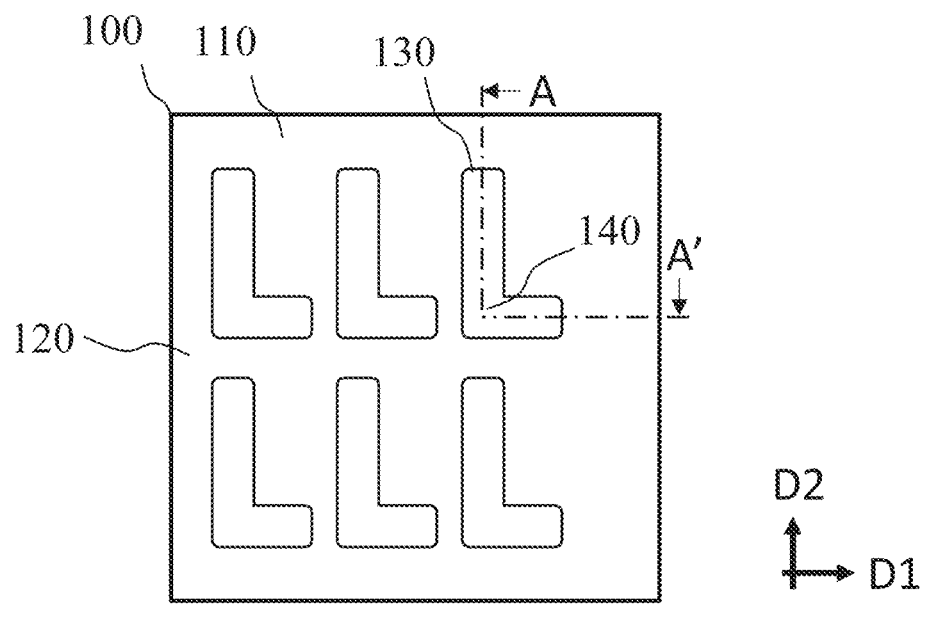
FIG. 1A shows a layer 100 including a topological insulator in accordance with various embodiments.

The following detailed description refers to the accompanying drawings that show, by way of illustration, specific details and embodiments in which the disclosure may be practiced. These embodiments are described in sufficient detail to enable those skilled in the art to practice the disclosure. Other embodiments may be utilized and structural, and logical changes may be made without departing from the scope of the disclosure. The various embodiments are not necessarily mutually exclusive, as some embodiments can be combined with one or more other embodiments to form new embodiments.

Embodiments described in the context of one of the layers, electronic devices, and methods are analogously valid for the other layers, electronic devices, and methods.

Features that are described in the context of an embodiment may correspondingly be applicable to the same or similar features in the other embodiments. Features that are described in the context of an embodiment may correspondingly be applicable to the other embodiments, even if not explicitly described in these other embodiments. Furthermore, additions and/or combinations and/or alternatives as described for a feature in the context of an embodiment may correspondingly be applicable to the same or similar feature in the other embodiments.

In the context of various embodiments, the articles "a", "an" and "the" as used with regard to a feature or element include a reference to one or more of the features or elements.

As used herein, the term "and/or" includes any and all combinations of one or more of the associated listed items.

As used herein, each of the terms "comprising" and "including" may include the meaning of being, being made of, or consisting of. For example, "comprising a topological insulator" or "including a topological insulator" may include the meaning of being, being made of, or consisting of a topological insulator.

As used herein and in accordance with various embodiments, each pattern may by or include a chirality. For example, each pattern may be chiral, which are patterns that cannot be superimposed to their mirror symmetric shapes, like e.g. the "L"-shape.

As used herein and in accordance with various embodiments, a topological insulator may refer to a topological insulator metamaterial. Topological insulators as used herein have a dependence of the photocurrent direction on the helicity of circularly polarized optical excitation. While the helicity dependent photocurrent, underpinned by spin-momentum locking of surface Dirac electrons, is weak and easily overshadowed by bulk contributions, it is shown herein that the chiral response is enhanced by the provision of a plurality of patterns, provided by nanostructuring.

As used herein and in accordance with various embodiments, a pattern may refer to a surface structure or also named as surface relief, which may include positive and/or negative portions. A positive portion is a protrusion out of a surface plane of the layer, and a negative portion is a depression into the surface plane of the layer. The pattern may include at least a non-straight elongated portion. Other portions of the pattern may be straight, thus, the pattern may further include straight portions.

As used herein according to various embodiments, a non-straight elongated portion may include the meaning of a pattern portion that extends in the plane formed by D1 and D2 (or parallel thereof as long as on a surface of the layer) including at least a bent or a curve. For example, the pattern may be "L" shaped, square shaped, rectangular shaped, "C" shaped.

FIG. 1A shows a layer 100 including a topological insulator in accordance with various embodiments. The layer 100 includes a first main surface 110 extending in first and second directions D1 and D2. The first direction D1, the second direction D2, and a thickness direction D3 of the layer 100 are each perpendicular to the other. The layer 100 further includes an arrangement 120 of a plurality of patterns shown by way of example on the first main surface 110. The arrangement may be viewed as plan view. The arrangement is shown in FIG. 1A as a rectangular arrangement, wherein patterns are arranged side-by-side along each of the first and second direction D1 and D2 (or parallel thereof as long as on a surface of the layer), however, the present disclosure is not limited to a rectangular arrangement. Patterns in FIG. 1A are shown in the shape of an "L" for illustration purposes, and the disclosure is not limited thereto. Each pattern 130 of the plurality of patterns includes at least a non-straight elongated portion 140.

The surface on the opposite side of the layer 100 (not seen in the plan view of FIG. 1A) is named as the second main surface.

Figure 1B:
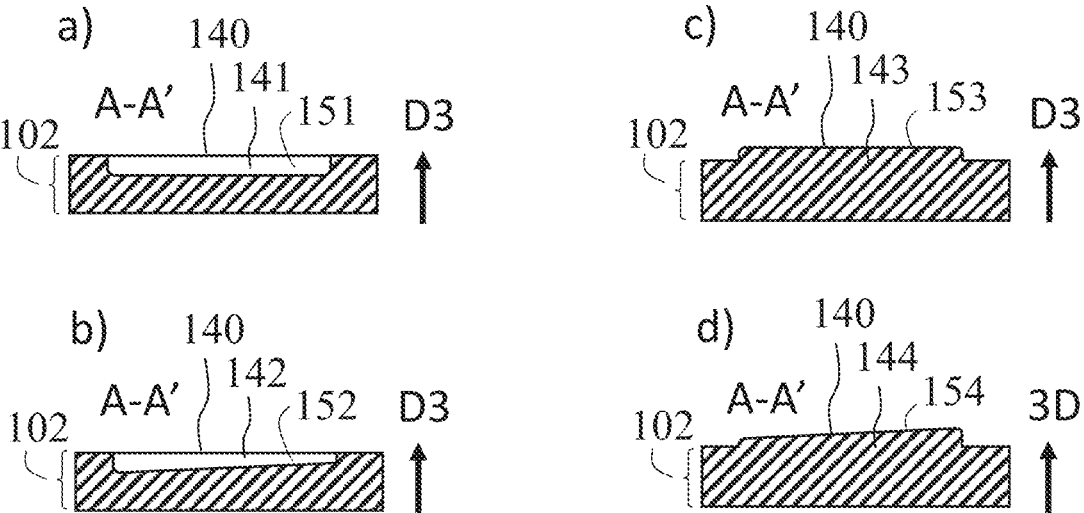
FIG. 1B shows exemplary variations of the pattern thickness in cross sectional views.

FIG. 1B shows exemplary variations of the pattern thickness in cross sectional views. The variations may be a recess, a protrusion, or a combination thereof. For example, part a) shows a possible cross sectional view A-A' of the layer 100, indicating a thickness 102 in the thickness direction D3, a non-straight elongated portion 140, which can be seen in FIG. 1A as having a bent thus forming the "L"-shape. The pattern includes a surface recess 141 of homogeneous depth 151 in the thickness direction D3.

Part b) of FIG. 1B shows another example of a possible cross sectional view A-A' of the layer 100, indicating a thickness 102 in the thickness direction D3, a non-straight elongated portion 140, which can be seen in FIG. 1A as having a bent thus forming the "L"-shape. The pattern includes a surface recess 142 of non-homogeneous depth 152 in the thickness direction D3, i.e., the surface recess may be deeper in some part (e.g., one end of the elongated pattern) and shallower in another part (e.g., another end of the elongated pattern). In some embodiments, the depth may change continuously by a constant degree along the elongation of the elongated pattern. Such a pattern may allow for the chirality effect to be present at normal incidence, for example, "L"-shape with different thickness may allow for Giant Circular Photogalvanic Effect at normal light incidence.

Part c) of FIG. 1B shows another example of a possible cross sectional view A-A' of the layer 100, indicating a thickness 102 in the thickness direction D3, a non-straight elongated portion 140, which can be seen in FIG. 1A as having a bent thus forming the "L"-shape. The pattern includes a surface protrusion 143 of homogeneous height 153 in the thickness direction D3.

Part d) of FIG. 1B shows another example of a possible cross sectional view A-A' of the layer 100, indicating a thickness 102 in the thickness direction D3, a non-straight elongated portion 140, which can be seen in FIG. 1A as having a bent thus forming the "L"-shape. The pattern includes a surface protrusion 144 of non-homogeneous height 154 in the thickness direction D3, i.e., the surface protrusion may be higher in some part (e.g., one end of the elongated pattern) and shallower in another part (e.g., another end of the elongated pattern). In some embodiments, the height may change continuously by a constant degree along the elongation of the elongated pattern. Such a pattern may allow for the chirality effect to be present at normal incidence, for example, the non-homogenous height may allow for Giant Circular Photogalvanic Effect at normal light incidence.

In some embodiments, a pattern may include a combination of recess and protrusion in different portions. According to various embodiments, a surface protrusion may might allow the use of an additional material to generate the protrusion, thus reducing possible damage to the underling topological insulator introduce by material removal during recess fabrication which may be at least partially avoided.

Figure 2:
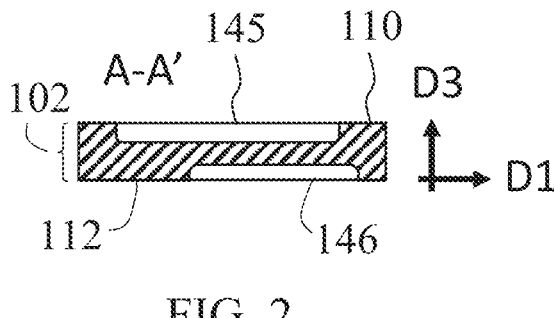
FIG. 2 shows another exemplary variation of a pattern, in which, in addition of the pattern on the first main surface, an additional pattern is provided on an opposing surface of the layer, which is on an opposite side to the first main surface.

FIG. 2 shows another exemplary variation of a pattern in cross sectional view, in which, in addition to a pattern portion on the first main surface 110, represented by recess 145 on the first main surface 110, an additional pattern portion, represented by recess 146, is provided on the second main surface 112. Recess 145 and recess 146 are shown by way of example, however, each can have any other arrangement or thickness, for example as explained in connection with FIG. 1B a) to d).

According to various embodiments, the term "depth" may also be referred to as a thickness, e.g., a (negative) thickness of a surface recess. According to various embodiments, each pattern 130 may include a surface recess 141, 142. Further, a thickness of the pattern 130 may be a depth 151, 152 of the surface recess.

According to various embodiments, the term "height" may also be referred to as a thickness, e.g., a (positive) thickness of a surface protrusion. According to various embodiments, each pattern 130 may include a surface protrusion 143, 144. Further, a thickness of the pattern 130 may be a height 153, 154 of the surface protrusion.

According to various embodiments, each pattern 130 may include uniform thickness along the non-straight elongated portion 140 or along an elongation of the pattern 130.

According to various embodiments, each pattern 130 may include varying thickness along the non-straight elongated portion 140 or along an elongation of the pattern 130.

According to various embodiments, each pattern 130 may include a chirality.

According to various embodiments, the chirality may be present under an oblique angle.

According to various embodiments, the chirality may be present under a normal angle.

According to various embodiments, the arrangement 120 may form a lattice, for example, a square lattice.

According to various embodiments, the pattern may include or be an L-shape.

According to various embodiments, the pattern may include or be a square.

According to various embodiments, a spacing of the lattice may be selected in a range from 50 nm to 3 millimeters, for example, for light in the visible range of wavelengths, the spacing may be selected between 50 nm to 500 nm (endpoints included), for mid-infra-red the spacing may be selected between 0.5 micrometers to 50 micrometers (endpoints included), and for Thz-microwave range, the spacing may be selected from the range of greater than 50 micrometers and smaller or equal to 3 millimeters. A track width of each pattern may be selected as smaller than $\frac{1}{5}$, or smaller than $\frac{1}{10}$ of the spacing of the lattice. In case that the spacing of the lattice is different in one direction (D1) from the other (D2), then the spacing of the lattice is the smallest spacing.

According to various embodiments, a track depth of each pattern may be selected in the range from 50 nm to 200 nm.

According to some embodiments, a recess may be formed by etching, e.g., ion beam etching.

According to some embodiments, a protrusion may be formed by etching away material from regions around the protrusion.

According to various embodiments, each pattern 130 may be configured to resonantly increase optical absorption at a resonant wavelength compared to a pattern free and otherwise identical layer.

According to various embodiments, the pattern 130 may be configured to generate a photocurrent which may be depending on a helicity of circularly polarized optical excitation.

According to some embodiments, an absorption and/or a photocurrent of the layer depends on the helicity of circularly polarized optical excitation at oblique angles. Oblique as used herein means not at a normal incidence, in other words, not parallel to D3. According to some embodiments, the absorption may depend on the helicity of circularly polarized optical excitation.

According to some embodiments, an absorption and/or a photocurrent depends on the helicity of circularly polarized optical excitation at normal angle. The normal angle is of a line of incidence parallel to D3.

According to various embodiments, the topological insulator may include transitional metal chalcogenides.

According to various embodiments, the topological insulator may include Bi, Sb, Te, and Se.

According to various embodiments, the topological insulator may be $Bi_{1.5}Sb_{0.5}Te_{1.8}Se_{1.2}$.

Figure 3:
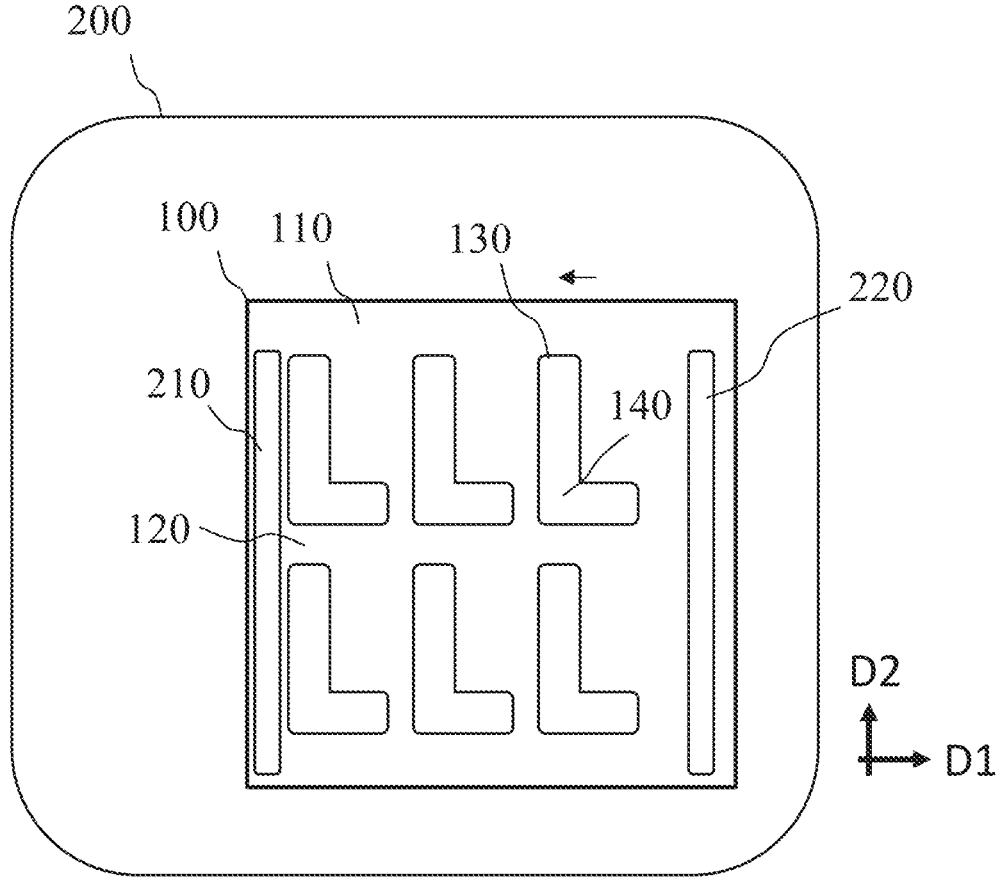
FIG. 3 shows an exemplary electronic device 200 including the layer 100 including a topological insulator.

FIG. 3 shows an exemplary electronic device 200 including the layer 100 including a topological insulator. The electronic device 200 may further include first and second electrodes 210 and 220 on the layer 100. The first and second electrodes 210 and 220 may be configured to provide electrical connection to the layer 100. The first and second electrodes 210 and 220 are disposed on a same main surface, for example on the first main surface 110, or on the second main surface 112. In each of FIGS. 1A and 3, a total of 6 patterns are shown for illustration purposes, however the disclosure is not limited thereto.

Figure 4:
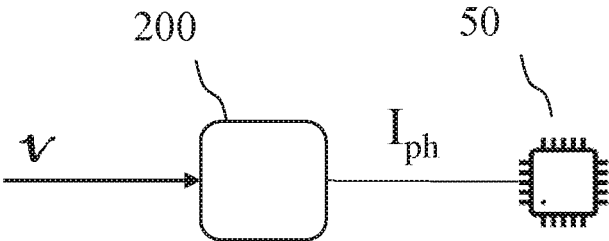
FIG. 4 shows a schematic example of an electrical connection between the electronic device 200 and an electronic component 50.

FIG. 4 shows a schematic example of an electrical connection between the electronic device 200 and an electronic component 50. The electronic component 50 is represented with the symbol of a chip, however it is not limited thereto (nor to any specific number of pins). Also, electric ground is not shown for ease of representation. According to various embodiments, an electronic component, may be a transistor, a resistor, a capacitor, an analog to digital converter, an integrated circuit including any of the foregoing, or a combination thereof. According to various embodiments, the electronic device may be selected from: a polarization sensitive photodetector; a spin polarized photodetector; a device for measuring molecular chirality; a quantum opto-spintronic device for transferring of polarization and entanglement from photons to electron spins.

According to various embodiments, the first and second electrodes 210 and 220 may be disposed apart from each other on the first main surface of the layer 100.

According to various embodiments, the layer 100 may be monocrystalline.

Figure 5:
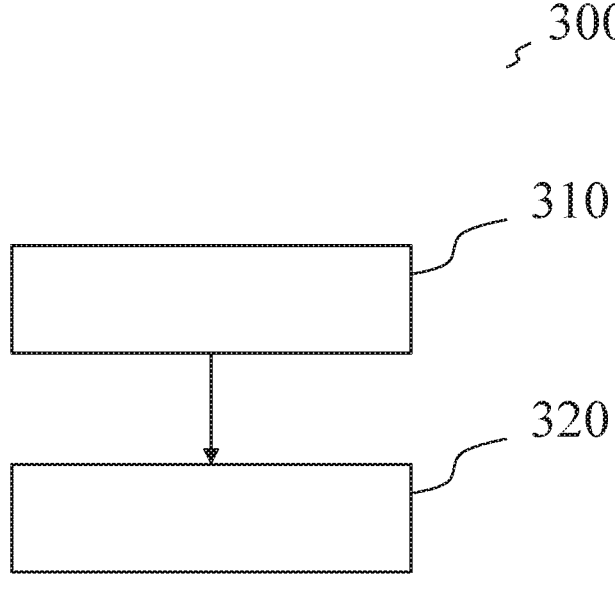
FIG. 5 shows a flowchart of a method 300 of controlling spin transport in the layer 100 including a topological insulator (TI)

FIG. 5 shows a flowchart of a method 300 of controlling spin transport in the layer 100 including a topological insulator. The method 300 includes: applying 310 circularly polarized light on the layer 100; and driving 320 an electronic component 50 with a photocurrent produced in the layer 100 by the circularly polarized light.

Various embodiments relate to a use of the layer 100 including a topological insulator in an electronic device 200. The electronic device 200 may be selected from: a polarization sensitive photodetector; a spin polarized photodetector; a device for measuring molecular chirality; a quantum opto-spintronic device for transferring of polarization and entanglement from photons to electron spins.

The arrangement of patterns, as described herein, enables a Giant Circular Photogalvanic Effect in the layer, thus, helicity of circular polarized light may be easily measured, for example, as a photocurrent.

Chirality, or the property of objects to be distinguishable from their respective mirror images, is a ubiquitous and fascinating phenomenon in nature. It manifests itself at a variety of scales and forms, from galaxies to nanotubes, from organic molecules, to inorganic compounds. Detection of chirality at the molecular or atomic level is key to fundamental sciences (e.g., chemistry, biology, crystallography) and practical applications (e.g., food and pharmaceutical industry), yet very challenging. Detection of chirality relies on the interaction with electromagnetic fields, which is hindered by the large mismatch between the wavelength of light and the size of most molecules and crystalline unit cells, thereby resulting in nearly imperceptible twists of the light field over nanoscale dimensions. Thus, the layer, and electronic device, disclosed herein, has a multitude of applications.

In the layer according to various embodiments, a component of the photocurrent that is measurable as depending on the helicity of an incident circular polarized light is extrinsical to the material and shown to be intrinsical to the layer and induced by the arrangement of the plurality of patterns. Said component of the photocurrent is also named herein as helicity-dependent photocurrent (HDPC). In the layer according to various embodiments, a component of the photocurrent that is measurable as depending on the helicity of an incident circular polarized light may be $\frac{1}{5}$ or more of the total magnitude of the photocurrent, preferably $\frac{1}{3}$ or more.

EXAMPLES

Photocurrent measurements were performed at room temperature, illuminating the devices with continuous wave laser (λ=532 nanometers (nm)) and with no applied bias. The linearly polarized laser beam was modulated at frequency of 137 Hertz (Hz) by an optical chopper before passing through a λ/4 retarder, and focused to a spot size of about 200 micrometers (μm) diameter at the centre of the electrodes. The experimental setup allows to continuously vary the polarization of incident light from linear (s-polarized) to circular (LCP and RCP) by rotating the λ/4 wave plate. The incident light polarization was calibrated by a polarimeter. The photocurrent was measured with a lock-in amplifier referenced to the light modulation frequency. In all samples, the photocurrent was found to be linearly dependent on excitation intensity. All the measurements were performed at a constant illumination intensity of 10 Wcm$^{-2}$.

Herein, use of artificial nanostructuring to enhance the chiral photo-galvanic response of topological insulators such as BSTS is demonstrated. Due to the tight confinement of electromagnetic fields, resonant non-chiral metamaterials effectively enhance the photoexcitation of spin-polarized states, thereby increasing the unbalance between surface-state carriers with opposite spin helicity, and overall resulting in a giant enhancement of the extrinsic chiral photocurrent response of a 3D topological insulator (TI).

FIGS. 6A to 6D are used to explain the theory of the physical mechanism in the layer under circularly polarized light, however the disclosure is not limited to this theory. Surface carriers can be selectively excited in topological insulators (TI) by circularly polarized light directed at oblique incidence on the surface of the crystal, and the resulting current flow is determined by the spin-momentum locking of the carriers. As the topological insulator crystal is intrinsically achiral (the surface states have equal number of carriers with opposite spin orientations), and the relevant spins lay in the surface plane of the crystal, photoexcitation at normal incidence does not generate any HDPC. However, spin-selective photoexcitation of surface state carriers by obliquely incident light with a given helicity induces chirality (unbalance in the populations of surface state carriers with opposite spin orientations). This effect, named as Circular Photogalvanic Effect (CPGE), is illustrated in FIG. 6A. In an unstructured topological insulator, Dirac electrons with spin coupled to a given circular polarization of incident light (filled circles with arrows pointing downwards) are promoted to higher bands in the k-space; the excess of spin-momentum locked surface-state electrons with opposite spin (circles with arrows pointing upwards) gives rise to a helicity-dependent photocurrent, j$_a$ (circular photogalvanic effect). In other words, a light beam of defined handedness selectively promotes carriers of matching spin from surface to bulk conduction bands, thus leaving the surface bands asymmetrically depopulated in k-space: the excess surface carriers of opposite spin generate the net spin-polarized electrical current, j$_a$.

FIG. 6B shows, that in an exemplary layer in accordance with various embodiments, a larger number of spin-polarized electrons is photoexcited upon resonant light absorption, enhancing the HDPC. The presence of the arrangement of the plurality of patterns as a nanostructure on the surface of TI provides a resonant absorption at the wavelength of excitation, effectively increasing the number of surface conduction carriers which are promoted to the bulk conduction bands, thus significantly enhancing the CPGE contribution to the photocurrent.

FIG. 6C is a schematic of an HDPC experimental setup, illustrating the mutual orientation of the electrodes on a TI device relative to the laser excitation beam at incidence angle θ and polarization defined by the angle of rotation φ of a quarter waveplate. As shown, light is incident at a variable angle, θ, on the surface of the topological insulator crystal (D1-D2 plane), and the light polarization is changed continuously from linear to circular by rotating a quarter wave plate, whose fast axis forms an angle φ, with the polarization axis. Without any applied bias a HDPC flows across the two electrodes (in this example, gold contacts) which is measured on the layer in accordance with various embodiments.

FIG. 6D shows a scanning electron microscope (SEM) image of an exemplary layer in accordance with various embodiments, wherein each pattern is a square ring metamaterial carved between the electrodes on the surface of a TI layer (scale bars are 1 micrometer on the left and 100 nm on the right). To assess the enhancement of chirality exclusive to topological surface spin currents, a metamaterial design which does not introduce optical chirality, neither intrinsic nor extrinsic, was chosen. The metamaterial unit cells consist of square rings of about 200 nm lateral size and about 100 nm ring width, arranged on a square lattice of about 335 nm period. Such pattern was carved by focused ion beam (FIB) milling between two gold electrodes deposited on an about 250 nm thin BSTS flake, as shown in the scanning electron microscope (SEM) images in FIG. 6D.

Example 1

A layer as shown in FIG. 6D was designed to resonantly increase the optical absorption of the unstructured BSTS flake at the excitation wavelength, λ=532 nm, at both normal (θ=0°) and oblique (θ=45°) incidence.

FIG. 7A shows measured (dashed lines) and simulated (continuous lines) optical absorption of an unstructured BSTS flake and a nanostructured BSTS metamaterial as shown in FIG. 6D. Experimental data were collected with unpolarized light at normal incidence and NA=0.7, while simulations correspond to circularly polarized light incident at θ=0° and θ=45'; at λ=532 nm, the absorption of the BSTS metamaterial is ~0.7, twice that of the unstructured BSTS flake (~0.35). FIG. 7B and FIG. 7C show maps of the electric field intensity, |E|$^2$, at 10 nm below the top surface of the metamaterial unit cell at normal incidence, LCP and RCP, respectively.

The experimental and numerically simulated spectra of the BSTS metamaterial (FIG. 7A, right panel) show a resonant increase in optical absorption with respect to the case of unstructured BSTS (FIG. 7A, left panel). Following from the design symmetry, the metamaterial geometry does not induce any helicity dependence to the bulk response of the BSTS flake, as confirmed by the maps of electric field intensity for circularly polarized light of opposite handedness (FIG. 7B and FIG. 7C).

Figures 8A, 8B:
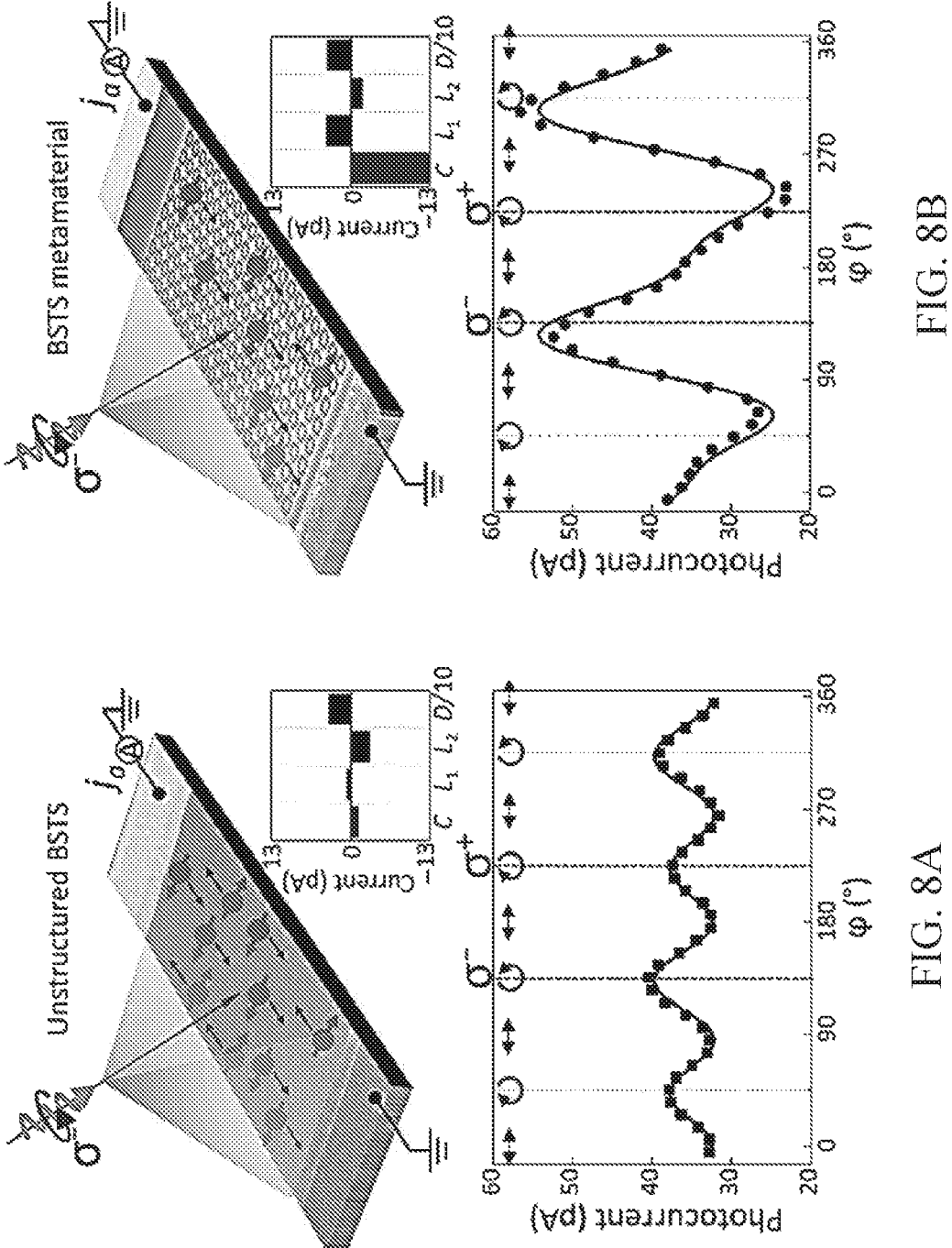
FIGS. 8A and 8B shows a comparison between an unstructured flake (FIG. 8A) and a metamaterial as a layer in accordance with various embodiments (FIG. 8B), and the resulting measurement of the photocurrent.

FIGS. 8A and 8B shows a comparison between an unstructured BSTS (FIG. 8A) and a BSTS metamaterial as a layer in accordance with various embodiments (FIG. 8B), and the resulting measurement of the photocurrent. FIG. 8A (top) is a schematic of HDPC in an unstructured BSTS flake and FIG. 8A (bottom) shows experimental photocurrent measured on an unstructured BSTS flake, at room temperature, and fitting, showing the expected 4φ dependence and a small 2φ asymmetry between right (σ$^+$) and left (σ$^-$) circularly polarized illumination. FIG. 8B (top) is a schematic of light HDPC in a nanostructured BSTS metamaterial and FIG. 8B (bottom) shows experimental photocurrent measured on a nanostructured BSTS metamaterial, at room temperature, and fitting, showing how the metamaterial induces a 2φ dependence which indicates that the sample responds almost exclusively to right ($\sigma^+$) and left ($\sigma^-$) circularly polarized illumination.

HDPC was measured under nearly uniform illumination using a laser beam diameter of about 200 micrometers, much larger than the BSTS device size of about 10 micrometers, with no applied bias. The residual un-uniformity of illumination results in thermal gradient that induces polarization-independent photo-thermoelectric currents, which contribute to the photocurrent background. This component of the current is sensitive to the position of the excitation beam on the sample. To measure a clearly distinguishable photocurrent signal, the laser beam was consistently positioned near the centre of the BSTS flake and the total photocurrent response was maximized. Contributions of surface carriers to the photocurrent, seen in HDPC, are allowed only at oblique illumination, as illustrated in the top section of FIG. 8A. The photocurrent, $j_a$, was measured shining the laser at $\theta=-45°$ and going through a full rotation cycle of its polarization angle, $\varphi$, from $0°$ to $360°$. This induces a continuous change of the incident polarization, from linear ($\varphi=0°$, $90°$) to circular of right ($\varphi=45°$) and left ($\varphi=135°$) handedness, with $180°$ period.

The bottom panel of FIG. 8A shows the photocurrent, $j_a$, measured in an unstructured BSTS flake (black filled squares). Without being bound by theory, it is believed that the current has the characteristic polarization dependent behaviour observed in other bi-chalcogenide topological insulators and other 2D material systems (e.g., quantum wells, transition metal dichalcogenide and Weyl semimetals). It comprises of four components, expressed by the phenomenological equation:

$$j_a = C \sin 2\varphi + L_1 \sin 4\varphi + L_2 \cos 4\varphi + D \qquad \text{Eq. (1)}$$

The coefficients D and $L_2$ are associated to photocurrent contributions from the semiconducting bulk. Specifically, D is related to the polarization independent photo-thermoelectric background current, which sets the overall directional current flow, while $L_2$ is related to the photon drag effect, which results from linear momentum transfer of the incident photons to the excited carriers. Conversely, the coefficients $L_1$ and C quantify photocurrent contributions from surface carriers. Such currents, driven by linear and circular polarization of the incident light, originate from the linear and circular photogalvanic effects, respectively. The dependence of the photocurrent on helicity is seen in the small asymmetry between the peaks corresponding to photoexcitation by light of opposite handedness ($\sigma^+$ and $\sigma^-$ in the bottom panel of FIG. 8A). The relative contribution of each surface and bulk component to the total photocurrent is shown in the bar plot of the coefficients of Eq. (1) (inset of FIG. 8A). While surface contributions to the photocurrent are discernible even at room temperature in the unstructured BSTS samples (due to the large surface to bulk conductivity known for this particular stoichiometry), their dependence on light helicity is overshadowed by bulk components (C/D=0.03), and too small for any practical device or application.

The very same BSTS flake, patterned with square ring metamaterial array, behaves dramatically differently. The resonant metamaterial structure induces much larger asymmetry in the population of surface conducting bands, increasing the net spin current (top schematic in FIG. 8B). The effect is so strong that the measured photocurrent (black filled circles in bottom panel of FIG. 8B) has a distinct $2\varphi$ evolution as function of polarization, irrespective of the contribution of linearly polarized components. The effect is even more apparent when comparing the coefficients of Eq. (1) (inset of FIG. 8B), where now C is far higher than the linear coefficients, $L_1$ and $L_2$, and its value accounts for a significant fraction of the photocurrent (C/D=0.33). Table 1 summarizes the fitting coefficients of photocurrents, $j_a$, for both unstructured and nanostructured BSTS, at and off normal incidence. The photocurrent circular dichroism induced by spin-polarized surface states can be defined as:

$$\rho_{circ} = \frac{|I_{\sigma^+} - I_{\sigma^-}|}{|I_{\sigma^+} + I_{\sigma^-}|} \qquad \text{Eq. (2)}$$

where $I_{\sigma+}$ and $-I_{\sigma-}$ are respectively the values of photocurrents under left and right circularly polarized optical excitation, excluding the spin insensitive component D. A 3-fold increase of the degree of spin polarization of unstructured BSTS ($\rho_{circ}=0.26$) is seen in the BSTS metamaterial ($\rho_{circ}=0.87$), an unprecedented degree of spin polarization approaching unity even at room temperature in non-magnetic materials.

Table 1, below, shows the fitting coefficients of the HDPC in unstructured BSTS flake and nanostructured BSTS metamaterials:

| $\theta$ (°) | BSTS flake | C (pA) | $L_1$ (pA) | $L_2$ (pA) | D (pA) |
|---|---|---|---|---|---|
| -45 | unstructured | $-1.1 \pm 0.1$ | $0.6 \pm 0.1$ | $-3.1 \pm 0.1$ | $35.4 \pm 0.1$ |
| | nanostructured | $-12.7 \pm 0.3$ | $4 \pm 0.3$ | $-1.8 \pm 0.3$ | $38.3 \pm 0.3$ |
| 0 | unstructured | $0.05 \pm 0.05$ | $-0.002 \pm 0.05$ | $0.09 \pm 0.05$ | $8.5 \pm 0.05$ |
| | nanostructured | $-0.2 \pm 0.04$ | $-0.2 \pm 0.04$ | $0.04 \pm 0.04$ | $11.4 \pm 0.04$ |
| 45 | unstructured | $1.0 \pm 0.1$ | $0.32 \pm 0.1$ | $-3.2 \pm 0.1$ | $35.1 \pm 0.1$ |
| | nanostructured | $11 \pm 0.4$ | $-0.9 \pm 0.4$ | $-3 \pm 0.4$ | $41.8 \pm 0.4$ |

Example 2: Dependence of Photocurrent on Beam Position and Laser Intensity

Figure 9A:
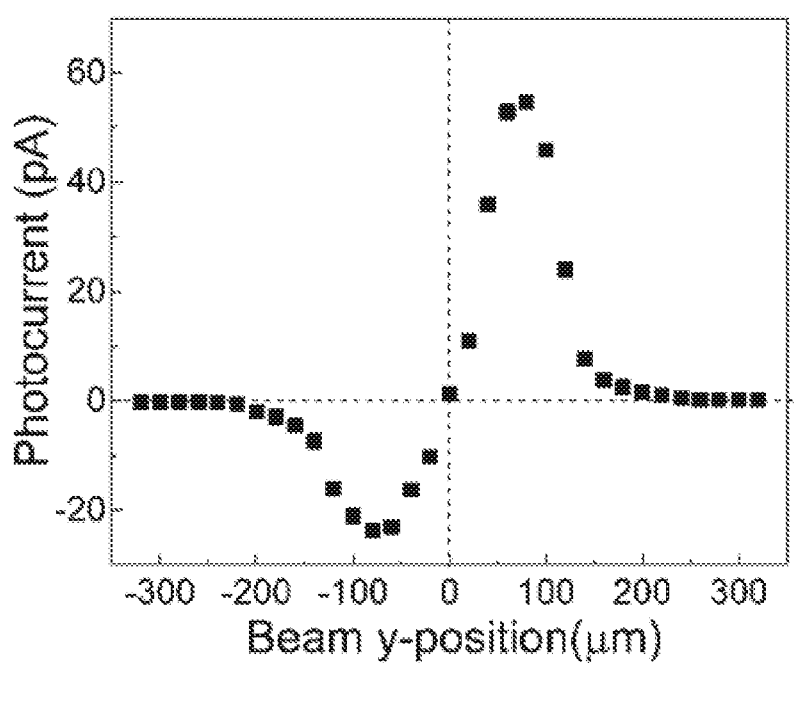
FIG. 9A shows the photocurrent of the unstructured flake as function of focused laser beam y-position at incident angle $\theta=30°$ and linearly polarized excitation.
Figure 9B:
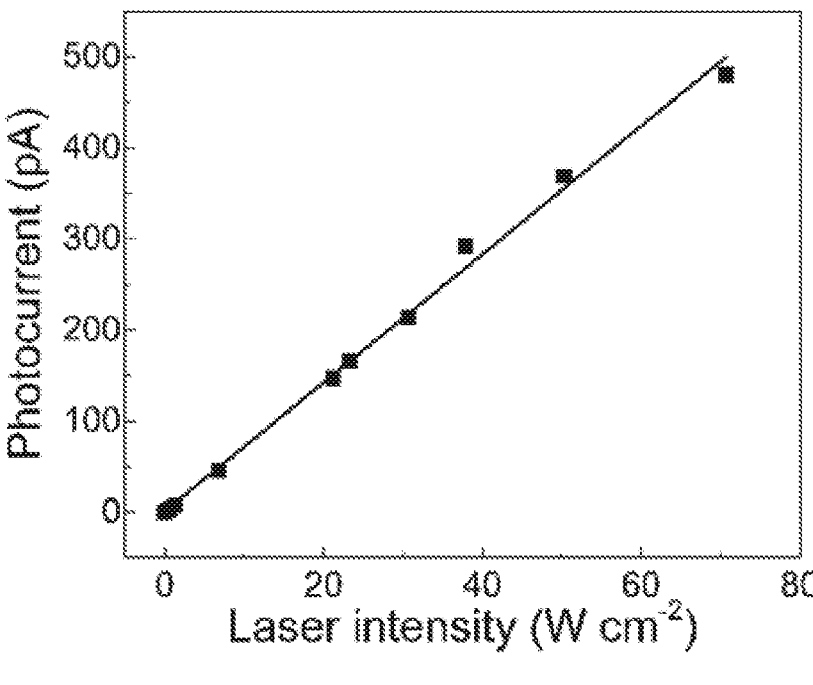
FIG. 9B shows the excitation intensity dependence of the photocurrent for linearly polarized light, at incidence angle of $\theta=-45°$.

FIGS. 9A and 9B show the dependence of photocurrent on beam position and laser intensity. FIG. 9A shows the photocurrent of the unstructured BSTS flake as function of focused laser beam y-position at incident angle $\theta=30°$ and linearly polarized excitation. The photocurrent dependence on beam position between the electrodes resembles a Gaussian derivative of order 1, with sign inversion at the central position (y=0) where the thermal gradient induced by the laser beam is minimal. FIG. 9B shows the excitation intensity dependence of the photocurrent for linearly polarized light, at incidence angle of $\theta=-45°$.

Laser induced thermal gradient in three-dimensional topological insulator BSTS devices is expected to generate a bulk photo-thermoelectric current, given its thermoelectric properties. The photo-thermoelectric current varies when moving the laser spot position (y) across the BSTS device, as shown in FIG. 9A. The photo-thermoelectric effect can be minimized positioning the laser at the centre of the device. To move away from noise and avoid unwanted sign variations of the current, all measurements discussed in the manuscript are carried at the laser beam position which maximizes the photo-thermoelectric current. The photocurrent induced by the thermoelectric effect is helicity independent. The measured photocurrent has a linear dependence with respect to laser intensity, as shown in FIG. 9B. To minimize sample heating, the laser is operated at low laser intensity ($10$ W $cm^{-2}$) regime.

Additional validation of the functional dependence of the HDPC on incidence angle $\theta$, is shown in FIGS. 10A to 10C and FIGS. 11A and 11B. Notably, the surface nature of HDPC in BSTS was also confirmed repeating the experiments on a trivial chalcogenide insulator of the same family, $Bi_2S_3$, where only bulk currents were measured (see Comparative Example 1).

Example 3: Dependence of CPGE on Incidence Angle $\theta$

Figures 10A, 10B, 10C:
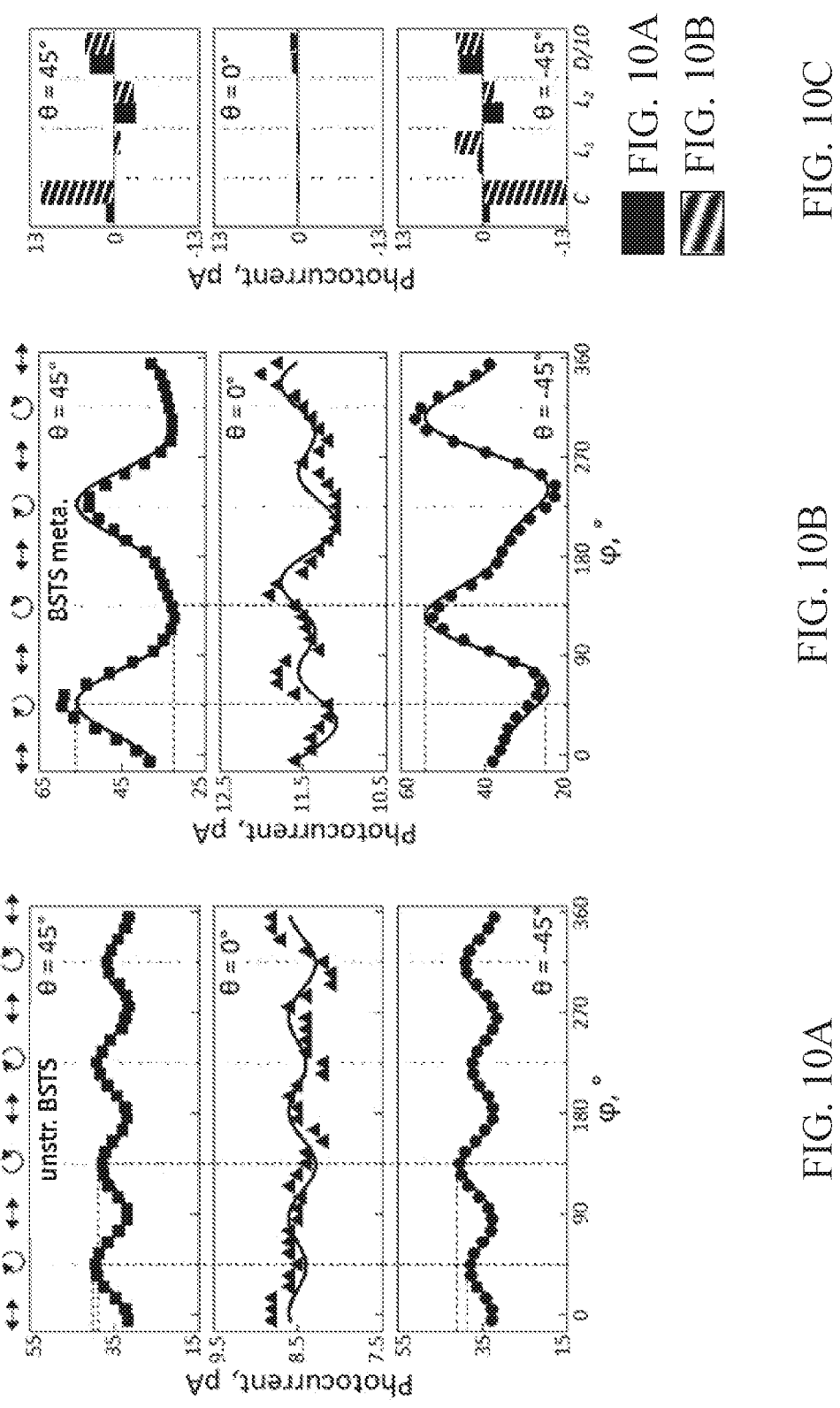
FIG. 10A shows the helicity dependent photocurrent (HDPC) of the unstructured BSTS material for 3 different angles.
FIG. 10B shows the HDPC of the BSTS metamaterial and the corresponding amplitude coefficients C, L1, L2, and D are reported in FIG. 10C.
Figure 11A:
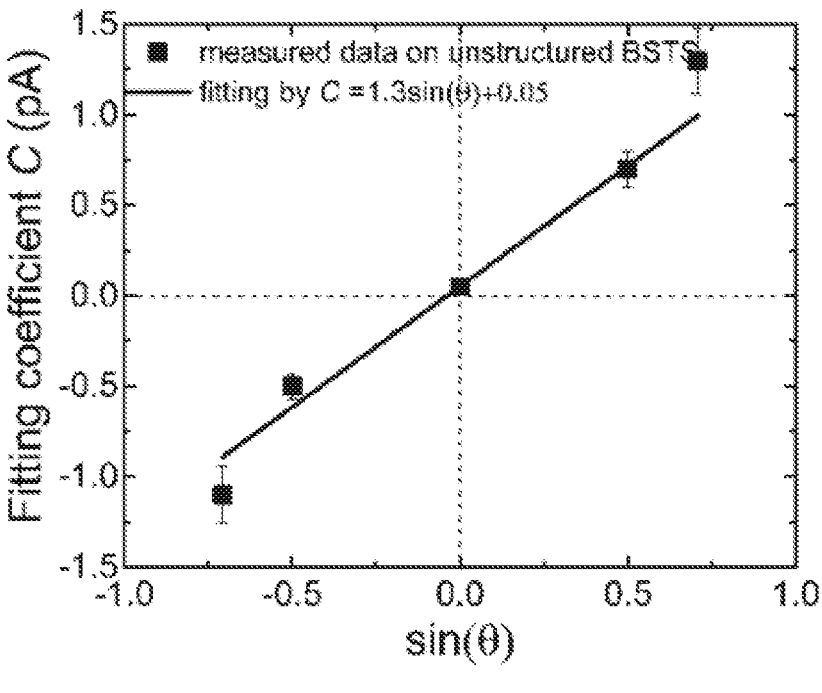
FIGS. 11A and 11B show the linear dependence of the photocurrent for both unstructured (FIG. 11A) and structured BSTS (FIG. 11A) and structured BSTS (FIG. 11B)
Figure 11B:
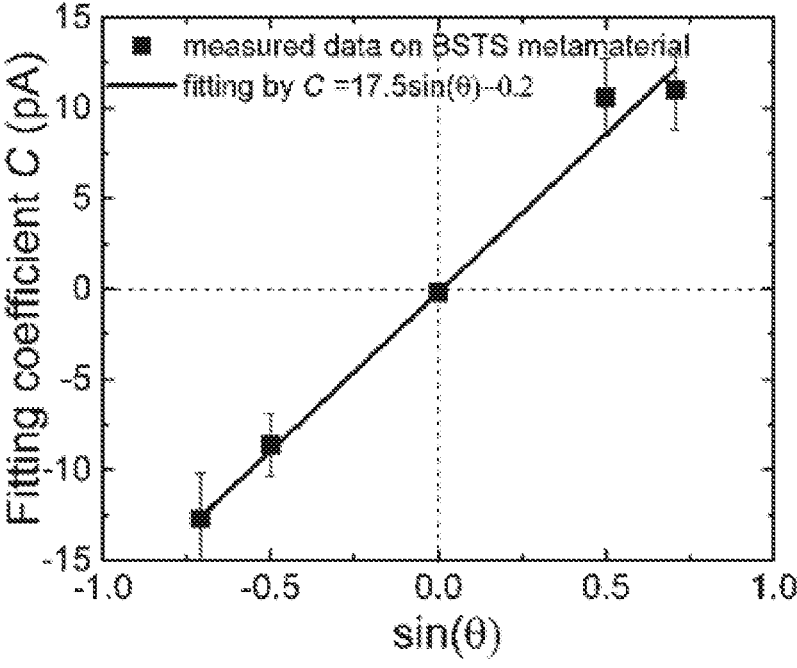

FIG. 10A shows the HDPC of the unstructured BSTS material for 3 different angles and FIG. 10B shows the HDPC of the BSTS metamaterial (i.e., layer in accordance with various embodiments) for 3 different angles. The 3 different angles of incidence are $\theta=45°$ (top panels), $\theta=0°$ (centre panels) and $\theta=-45°$ (bottom panels). In both cases, the experimental curves are fitted using Eq. (1) and the corresponding amplitude coefficients C, $L_1$, $L_2$, and D are reported in FIG. 10C. These measurements were repeated on both the unstructured BSTS flake and the BSTS to further validate the results of enhancement of CPGE in BSTS by metamaterials. Measurements were repeated on both the unstructured BSTS flake and the BSTS metamaterial at normal, $\theta=0°$, and oblique incidence angles, $\theta=\pm45°$, on the D1-D3 plane. The results of helicity photocurrent for unstructured BSTS and BSTS metamaterials are shown in FIG. 10A and FIG. 10B, respectively. The corresponding fitting coefficients of Eq. (1) for the photocurrent, $j_a$, are given in FIG. 10C. As expected, when the laser illuminates the samples at normal incidence, the HDPC vanishes in both the unstructured BSTS and the BSTS metamaterial. This is imposed by the three-fold rotational symmetry of the surface in BSTS crystal. Moreover, when light is directed at oblique incidence and mirror direction with respect to the normal, the signs of surface currents coefficients, C and $L_1$, are inverted, whereas those of the bulk currents coefficients, $L_2$ and D, remain unchanged. This is expected since the rotational symmetry of the surface is broken by the obliquely incident light, thus unbalancing the population of surface electrons with opposite spin orientations.

Example 4: Circular Photon Drag Effect

In addition to photo-thermoelectric and CPGE, the circular photon drag effect (CPDE) may contribute to HDPC. In order to identify the dominant mechanism, in FIGS. 11A and 11B the values of the coefficient C are plotted as function of $\sin(\theta)$ and a linear dependence for both unstructured (FIG. 11A) and structured BSTS (FIG. 11B) was obtained. Since the CPGE photocurrent is proportional to $\sin(2\varphi)\sin(\theta)$, while the CDPE contribution is proportional to $\sin(2\varphi)\sin(2\theta)^5$, this confirms that CDPE is negligible compared to CPGE. Moreover, the enhancement of CPGE in BSTS metamaterials compared to unstructured BSTS is about one order of magnitude at any oblique angle of incidence (17.5/1.3).

Comparative Example 1: Helicity Independent Photocurrent in Trivial $Bi_2S_3$ Measurements of HDPC were repeated in $Bi_2S_3$ as a comparative example. $Bi_2S_3$ is a trivial chalcogenide insulator of the same family of BSTS. Similar to the main experiments, an achiral $Bi_2S_3$ metamaterial device (FIG. 12A) was designed to increase absorption at the excitation wavelength of $\lambda=532$ nm (FIG. 12B). FIG. 12A shows an SEM image of a square ring metamaterial carved on the $Bi_2S_3$ flake in between Au/Cr electrodes (scale bars: 1 micrometer). In both unstructured and nanostructured $Bi_2S_3$ flakes, the photocurrent measured at oblique angle of incidence, $\theta=-45°$, comprises only bulk contributions, and the metamaterial does not produce any enhancement of chirality (FIG. 12B). This confirms that the effects observed in unstructured BSTS and BSTS metamaterials are truly associated to the chirality of topological surface carriers. For a given angle of incidence, the $j_a$ coefficients of both, unstructured and nanostructured BSTS, have equal sign, which reverses at mirror angles of incidence. This proves that the metamaterial does not introduce chirality but rather enhances the extrinsic chirality of the BSTS surface layer. FIG. 13 shows the simulated optical absorption under $\theta=0°$ (left) and $\theta=-45°$ (right), for the unstructured $Bi_2S_3$ and the metamaterial $Bi_2S_3$.

Example 5: Electromagnetic Modelling

Figures 14A, 14B:
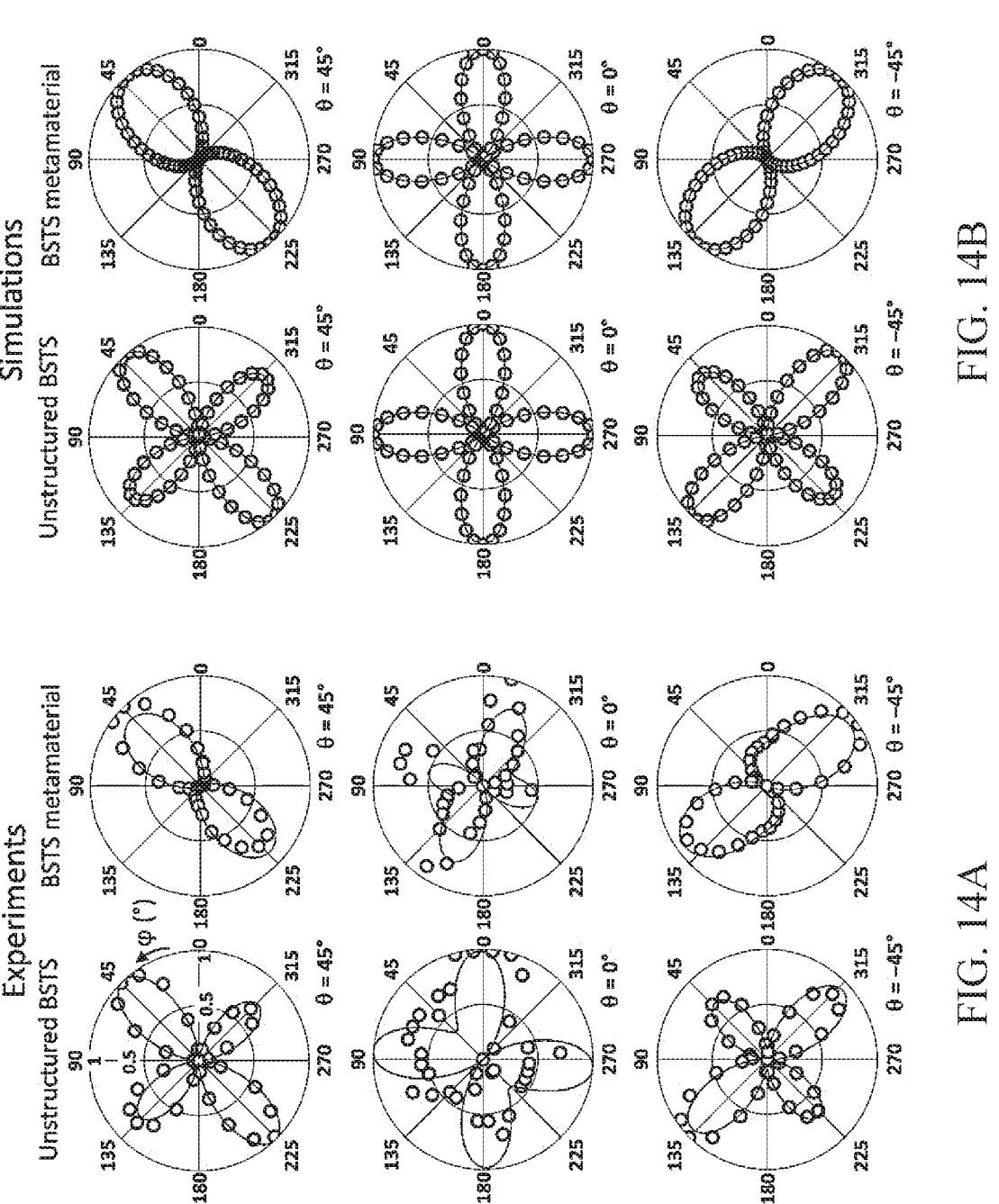
FIG. 14A shows normalized polar plots of HDPC for an unstructured BSTS flake (left column) and a nanostructured BSTS metamaterial (right column) at 3 different angles of incidence.
FIG. 14B shows simulated $|E|^2$ in both unstructured 250 nm BSTS film (left column) and nanostructured BSTS metamaterial (right column) at 3 different angles of incidence.

Without wanting to be bound by theory, a first attempt to describe the photocurrent behaviour of spin-transport metamaterials by electromagnetic modelling is detailed below. The generated photocurrent is directly proportional to the optical absorption, carrier density, mobility and lifetime of the topological insulator. Thus, under the assumption that the optical absorption of the BSTS metamaterial increases upon nanostructuring, while the remaining transport parameters remain unaltered, carrier anisotropy is mapped to an anisotropic optical model of the BSTS topological insulator crystal (FIGS. 14A and 14B). The unstructured BSTS crystal is described by its isotropic relative permittivity, &r (experimentally determined by ellipsometric measurements), modified by ad-hoc off-diagonal terms of the permittivity tensor to mimic the effective optical chirality induced by the in-plane spin of Dirac surface electrons. Full-wave electromagnetic simulations are performed for both unstructured and nanostructured BSTS, replicating the sample illumination conditions used in the experiments ($\lambda=532$ nm, $\theta=0$, $\pm45°$, $\varphi=0°$ to $360°$), and integrating the electric field intensity within the top 3 nm to evaluate the optical absorption at the surface of the topological insulator.

Briefly, FIG. 14A shows normalized polar plots of HDPC for an unstructured BSTS flake (left column) and a nanostructured BSTS metamaterial (right column) at 3 different angles of incidence, $\theta=45°$ (top row), $\theta=0°$ (centre row) and $\theta=-45°$ (bottom row); at $\theta=0°$, mostly $L_2$ contributes to the modulation of the photocurrent; at $\theta=45°$ and $\theta=-45$, the HDPC patterns of the unstructured BSTS flake and the BSTS metamaterial are distinctively different: the metamaterial distils the C term contribution to the photocurrent modulation, with respect to the unstructured BSTS flake, where $L_1$, $L_2$, and C have comparable amplitudes. FIG. 14B shows simulated $|E|^2$ in both unstructured 250 nm BSTS film (left column) and nanostructured BSTS metamaterial (right column) at 3 different angles of incidence, $\theta=45°$ (top row), $\theta=0°$ (centre row) and $\theta=-45°$ (bottom row), with artificially increased chirality of the optical permittivity, $\varepsilon_r$, of the BSTS; the distinct behavior observed in the unstructured BSTS and the BSTS metamaterial matches remarkably well with the measured photocurrent, indicating how the chirality of the surface carriers and the increased absorption given by the metamaterial result in a giant increase of the CPGE; the $|E|^2$ is integrated in a 3 nm thin slab at the surface of the film. To better visualize the polarization ($\varphi$) dependence of both experimental data and numerical model, the polarization independent background is subtracted from each curve and is normalized.

The electromagnetic modelling (FIG. 14B) is in excellent agreement with the experimental HDPC result (FIG. 14A), corroborating the link between anisotropic optical absorption at the BSTS surface and selective spin-photocurrent generation. The normalized polar plots in FIGS. 14A and 14B provide an immediate visualization of the prominence of linear components (4 lobes) versus circular components (2 lobes) in unstructured and nanostructured BSTS. While at normal incidence the BSTS metamaterial does not produce any notable effect, at oblique incidence it filters out linear components, distilling the response to circularly polarized light illumination, and leading to a giant enhancement of the chiral photocurrent. The degree of chirality predicted by the simulations, according to the same Eq. (2), is $\rho_{circ}=0.18$ for the unstructured BSTS, and $\rho_{circ}=0.89$ for the BSTS metamaterial, in excellent agreement with the values obtained experimentally (see FIG. 15 and description below). Furthermore, in both experiments and simulations, illumination from mirror directions of incidence (with respect to the normal) yields opposite phases, just as expected for extrinsic chirality.

The hitherto unrecognized ability of metamaterials to control surface transport in topological insulator by structural design provides a powerful toolbox to bridge the gap between nanophotonics and spin-electronics. It is shown herein that resonant nanostructures can be used to induce giant enhancement of the extrinsic chiral photocurrent response of a topological insulator. This approach can be used to exert control over spin-transport properties of other classes of quantum and topological materials (e.g. Weyl semimetals, van der Waals heterostructures), and find application in integrated spin-polarized photodetectors that are in great demand for ultrasensitive chiral molecular sensing and quantum opto-spintronic devices, where polarization and entanglement could be transferred from photons to electron spins.

Example 6: Electromagnetic Simulations 3D electromagnetic simulations were performed using COMSOL Multiphysics (COMSOL Inc.), using the experimental relative permittivity of BSTS, $\varepsilon_r$, obtained by ellipsometry. The anisotropic response along the x direction (D1) was introduced by assigning non-zero values to the off-diagonal terms of the permittivity tensor, $\varepsilon_{r(yz,zy)}=\pm j^*\varepsilon_{r(xx,yy,zz)}$, wherein y refers to D2 and z refers to D3. The incident wave polarization rotation, reproducing the experimental arrangement of polarizer and QWP, was obtained by introducing a $\varphi$ dependence to both, s and p components of the electric field with a $\pi/2$ phase retardation between the two. The electric field intensity plotted in the graphs was obtained by integrating the $|E|^2$ within a 3 nm thin slab from the surface.

Figures 15A, 15B, 15C:
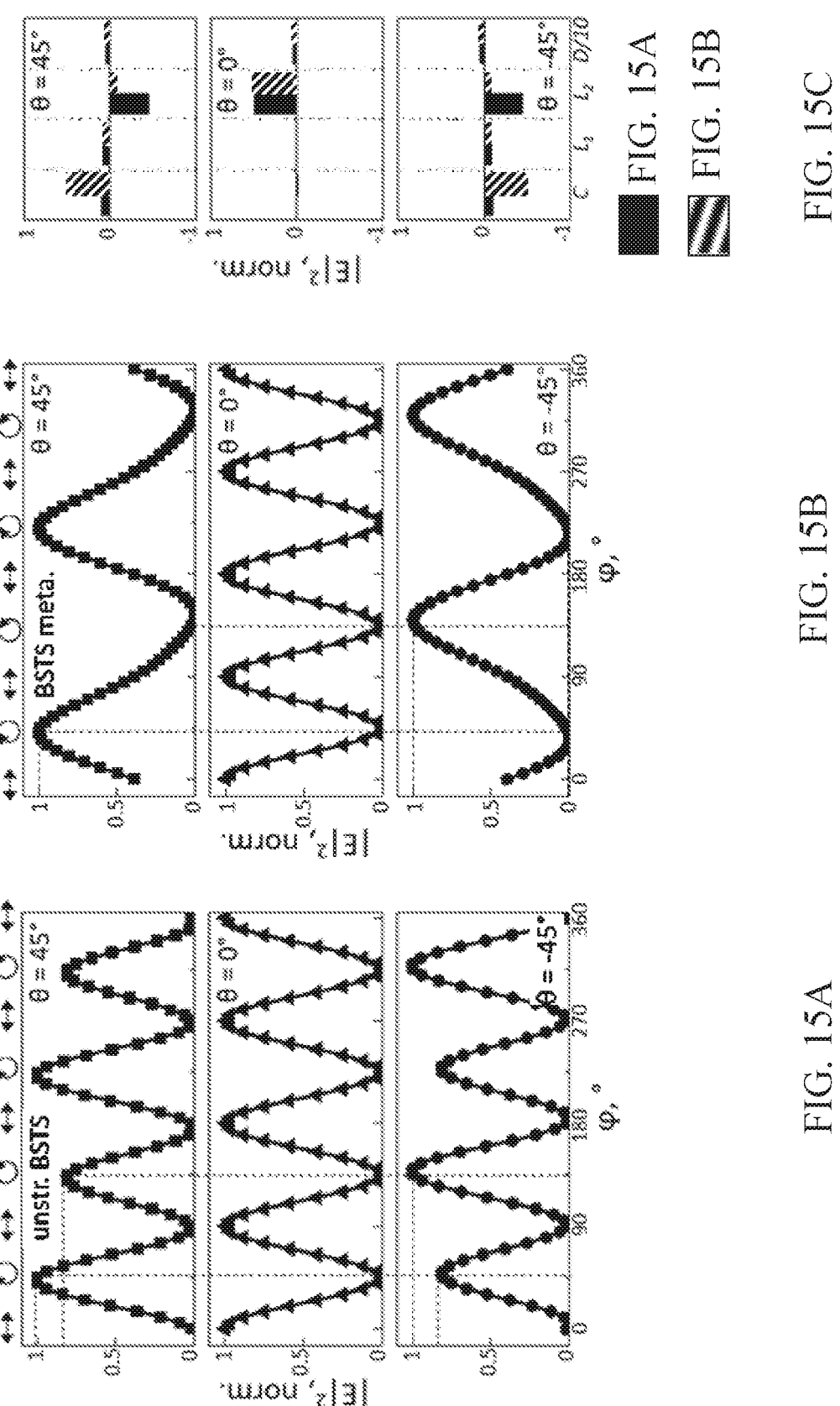
FIGS. 15A to 15C show the simulated electric field intensity, $|E|^2$, for unstructured 250 nm BSTS, for nanostructured BSTS metamaterial, and the resulting coefficients, respectively.

Example 7: Electromagnetic Simulations of Helicity-Dependent Absorption in BSTS FIGS. 15A to 15C show the simulated electric field intensity, $|E|^2$, for unstructured 250 nm BSTS (FIG. 15A) and for nanostructured BSTS metamaterial (FIG. 15B) with induced intrinsic chirality, at normal ($\theta=0°$) and oblique incidence angles ($\theta=\pm45°$) with artificially increased chirality of the optical permittivity, $\varepsilon_r$, of the BSTS. The simulated curves are fitted by a phenomenological equation analogous to Eq. (1), and the resulting coefficients are given in FIG. 15C. As expected, non-chiral (bulk) coefficients $L_2$ and D account for the largest part of $|E|^2$ at normal incidence, whereas the chiral (surface) coefficient C becomes significant at oblique incidence. The distinct behaviour observed in the unstructured BSTS and the BSTS metamaterial indicates how the chirality of the surface carriers and the increased absorption given by the metamaterial result in a giant increase of the CPGE; the $|E|^2$ is integrated in a 3 nm thin slab at the surface of the film. As in photocurrent experiments, the simulations also predict sign reversal of surface current coefficients C and $L_1$ at mirror angles of incidence, while the bulk coefficients $L_2$ and D are unaffected. The electromagnetic simulations also account for a ~5-fold increase of the degree of chirality of unstructured BSTS ($\rho_{circ}=0.18$) through the BSTS metamaterial ($\rho_{circ}=0.89$), in excellent agreement with experiments ($\rho_{circ}=0.26$ and $\rho_{circ}=0.87$ for unstructured BSTS and nanostructured BSTS, respectively).

Example 8: HDPC in Topological Insulators Chiral Metamaterials

Figure 16A:
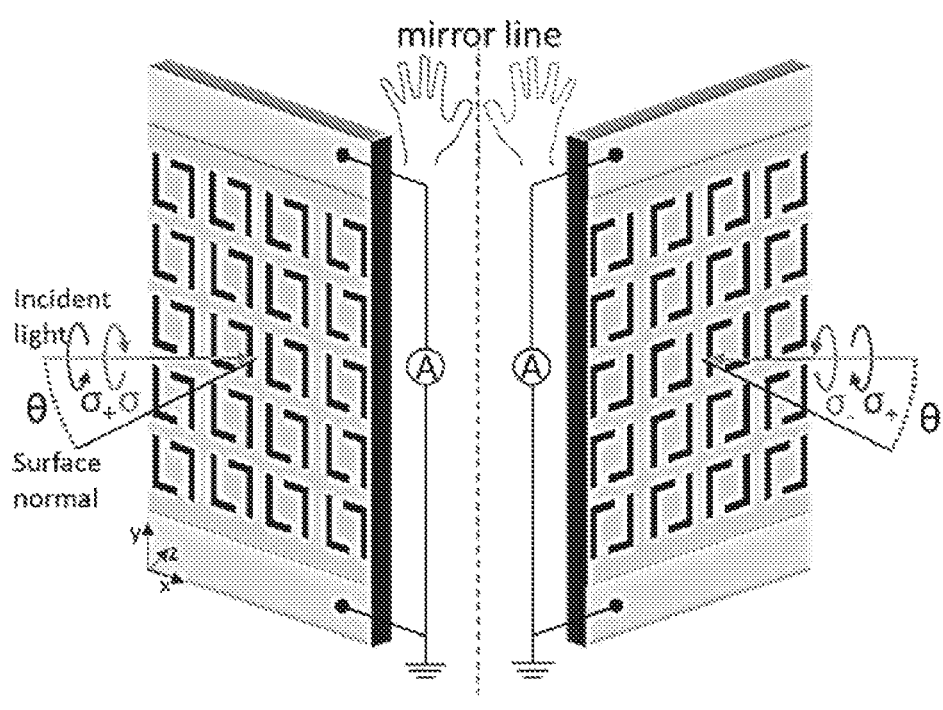
FIG. 16A shows a geometrical arrangement of the TI chiral metamaterial sample and illumination, with mirror symmetry line for the two handedness of the metamaterial design.
Figure 16B:
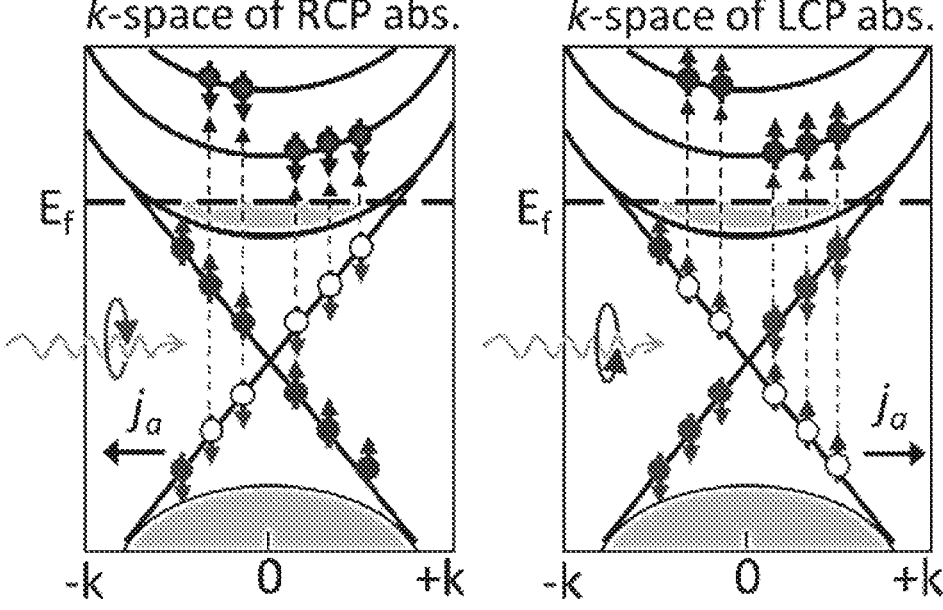
FIG. 16B shows a schematic of the bands in k-space.

FIG. 16A shows a geometrical arrangement of the TI chiral metamaterial sample and illumination, with mirror symmetry line for the two handedness of the metamaterial design. FIG. 16B shows a schematic of the bands in k-space. In a structured TI, a large number of spin-polarized Dirac electrons, with spin coupled to a given circular polarization of incident light (LCP or RCP), is photoexcited to higher bands in the k-space upon resonant light absorption, leading to an enhanced helicity dependent photocurrent (HDPC); the metamaterial chirality induces preferential photoexcitation of electrons with left spin (arrow pointing downwards) for a LCP (left panel) or right spin (arrow pointing upwards) for an RCP (right panel), acting effectively as a chiral polarization selecting device for RCP and LCP.

Figure 17A:
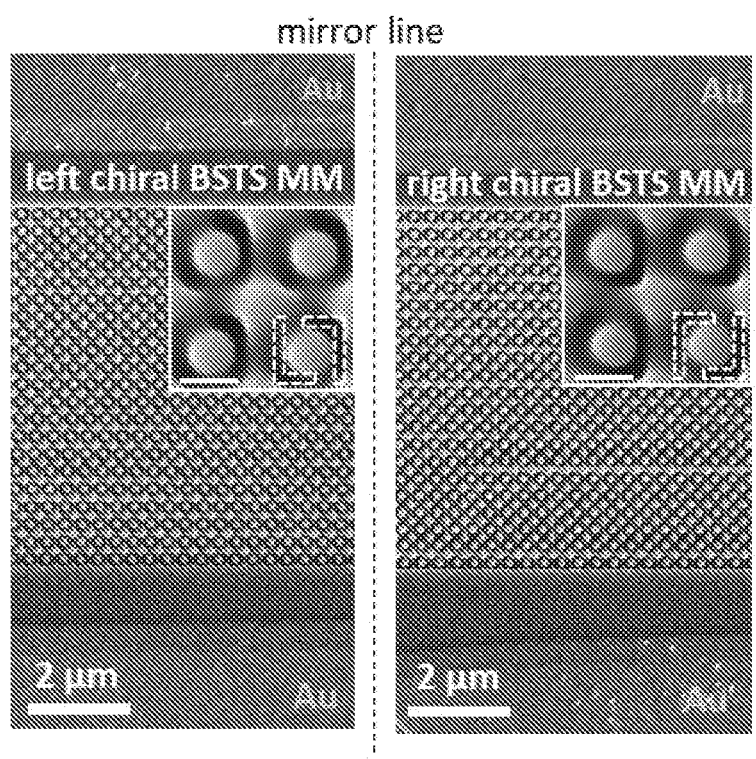
FIG. 17A shows a scanning electron microscope image of left and right chiral metamaterials carved between the gold (Au) electrodes on the surface of a TI flake.
Figure 17B:
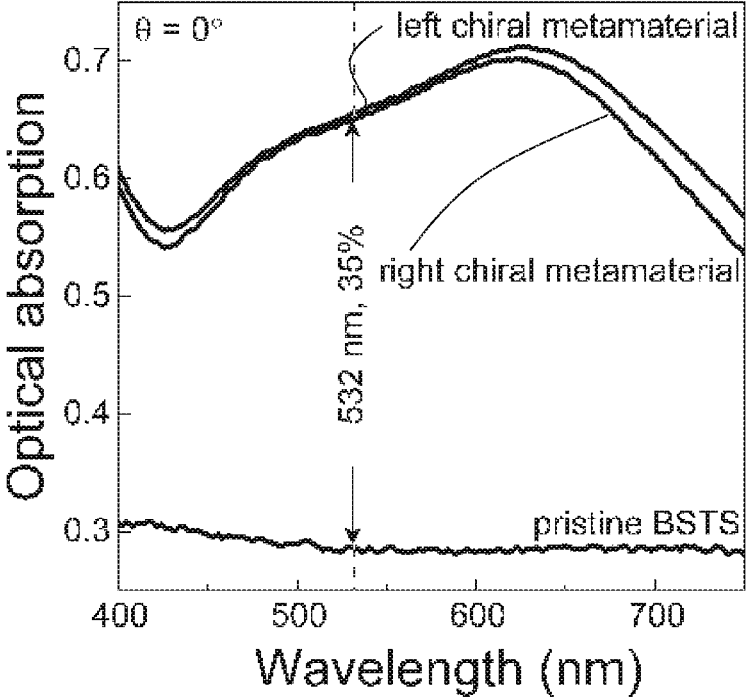
FIG. 17B shows experimental optical absorption of the pristine BSTS flake and the chiral BSTS metamaterials.

FIG. 17A shows a scanning electron microscope image of left and right chiral metamaterials carved between the Au electrodes on the surface of a TI flake. FIG. 17B shows experimental optical absorption of the pristine BSTS flake and the chiral BSTS metamaterials under unpolarized illumination at $\theta=0°$; the absorption at $\lambda=532$ nm of left chiral and right chiral metamaterials is more than 2 times higher than the pristine (unstructured) BSTS flake.

Figures 18A, 18B, 18C, 18D, 18E, 18F:
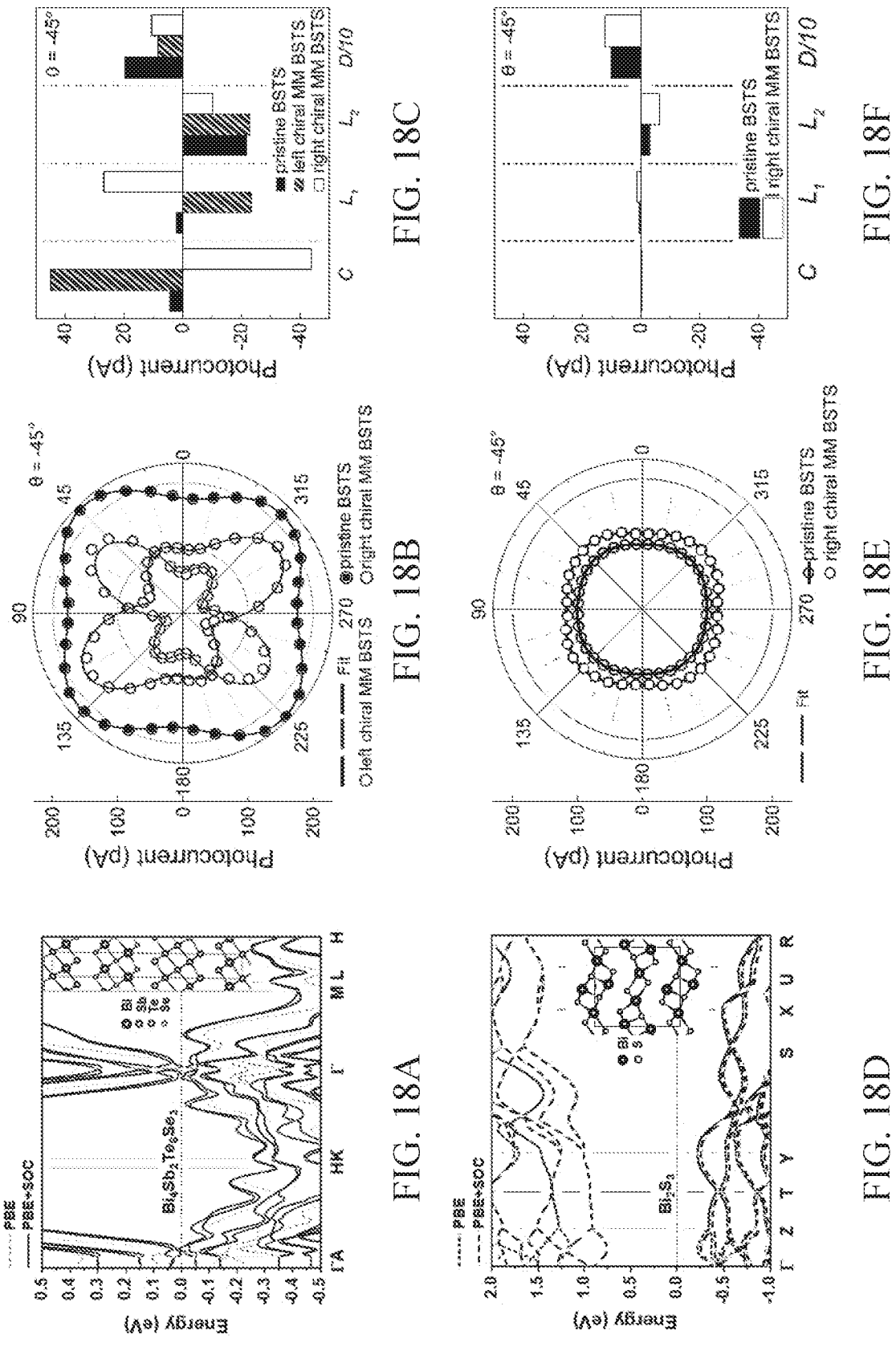
FIGS. 18A to 18B show a crystal structure and electronic band and photocurrent of BSTS topological insulator slabs.
FIG. 18C shows amplitudes of the fitting coefficients C, $L_1$, $L_2$, and D, indicating a giant enhancement of surface transport induced by the metamaterial.
FIG. 18D shows crystal structure and electronic band of the trivial insulator, $Bi_2S_3$, showing no Dirac cone formation when the spin-orbit coupling is activated.
FIG. 18E shows room temperature helicity independent photocurrent of $Bi_2S_3$ (line crossed circles) and $Bi_2S_3$ right chiral metamaterial (open circles) at an incident angle of $\theta=-45°$.
FIG. 18F shows amplitudes of the fitting coefficients C, $L_1$, $L_2$, and D, which show no enhancement of surface transport induced by the metamaterial.

FIGS. 18A to 18F show the HDPC in topological and trivial insulators chiral metamaterials. FIG. 18A shows a crystal structure and electronic band of a $Bi_4Sb_2Te_6Se_3$ (BSTS) topological insulator slab, showing the Dirac cone formation when the spin-orbit coupling is activated. FIG. 18B, shows room temperature HDPC of the pristine (unstructured) BSTS flake (filled black circles), BSTS left chiral metamaterial (inner curve) and BSTS right chiral metamaterial (middle curve) at an incident angle of $\theta=-45°$; FIG. 18C shows amplitudes of the fitting coefficients C, $L_1$, $L_2$, and D, indicating a giant enhancement of surface transport induced by the metamaterial. FIG. 18D shows crystal structure and electronic band of the trivial insulator, $Bi_2S_3$, showing no Dirac cone formation when the spin-orbit coupling is activated. FIG. 18E shows room temperature helicity independent photocurrent of $Bi_2S_3$ (line crossed circles) and $Bi_2S_3$ right chiral metamaterial (open circles) at an incident angle of $\theta=-45°$; FIG. 18F shows amplitudes of the fitting coefficients C, $L_1$, $L_2$, and D, which show no enhancement of surface transport induced by the metamaterial.

Figure 19:
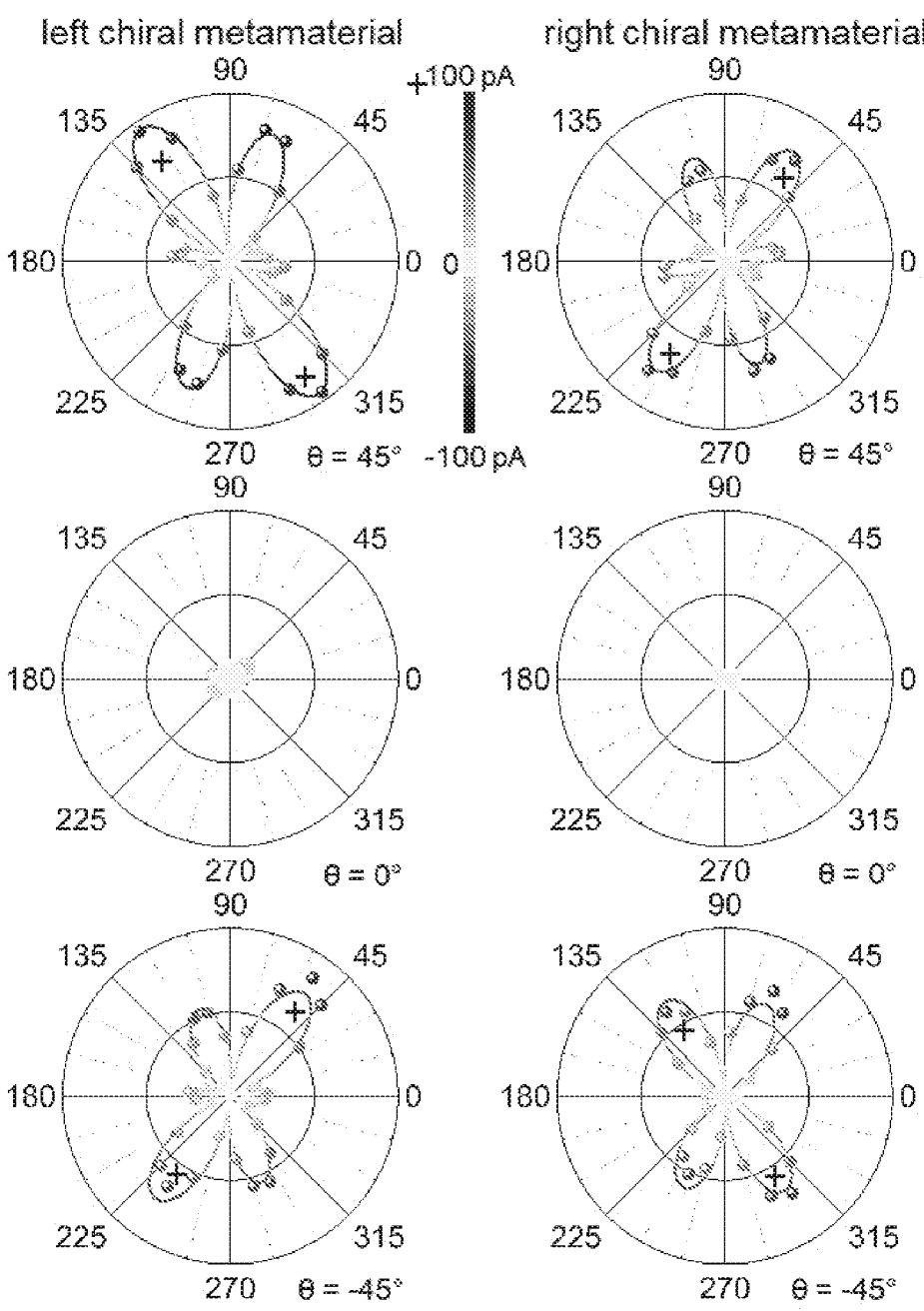
FIG. 19 shows polar plots of HDPC for a BSTS left chiral metamaterial (left column) and BSTS right chiral metamaterial (right column) at 3 different angles of incidence.

FIG. 19 shows polar plots of HDPC for a BSTS left chiral metamaterial (left column) and BSTS right chiral metamaterial (right column) at 3 different angles of incidence, $\theta=45°$ (top row), $\theta=0°$ (centre row) and $\theta=-45°$ (bottom row); the CPGE contributions are almost absent at $\theta=0°$ and dominant at oblique incidence, with mirror symmetric behavior for the angle of incidence (at $\theta=-45°$ and $\theta=45°$) and geometric chirality of the metamaterial design.

FIGS. 20A to 20F show photodetector properties of the TI metamaterial. FIGS. 20A and 20B show a dependence of amplitude and direction of CPGE and LPGE photocurrents on angle of incidence, q, for left and right chiral metamaterials. FIGS. 20C to 20E show a linear photocurrent of pristine (unstructured) BSTS flake, left and right BSTS metamaterials as function of laser intensity, at incident angle $\theta=-45°$; the chiral BSTS device show a clear preferential response on circular polarization, while this is missing in the unstructured case; FIG. 20F shows a linear CPGE photocurrent, with opposite direction for left and right chiral BSTS metamaterials.

Figure 21A:
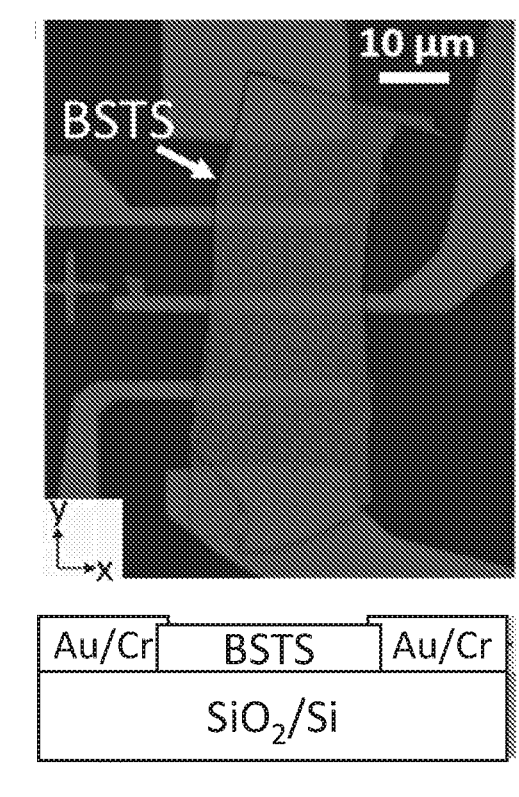
FIG. 21A shows a layout and a top microscopy view of a BSTS device and schematic of the device cross-section.
Figure 21B:
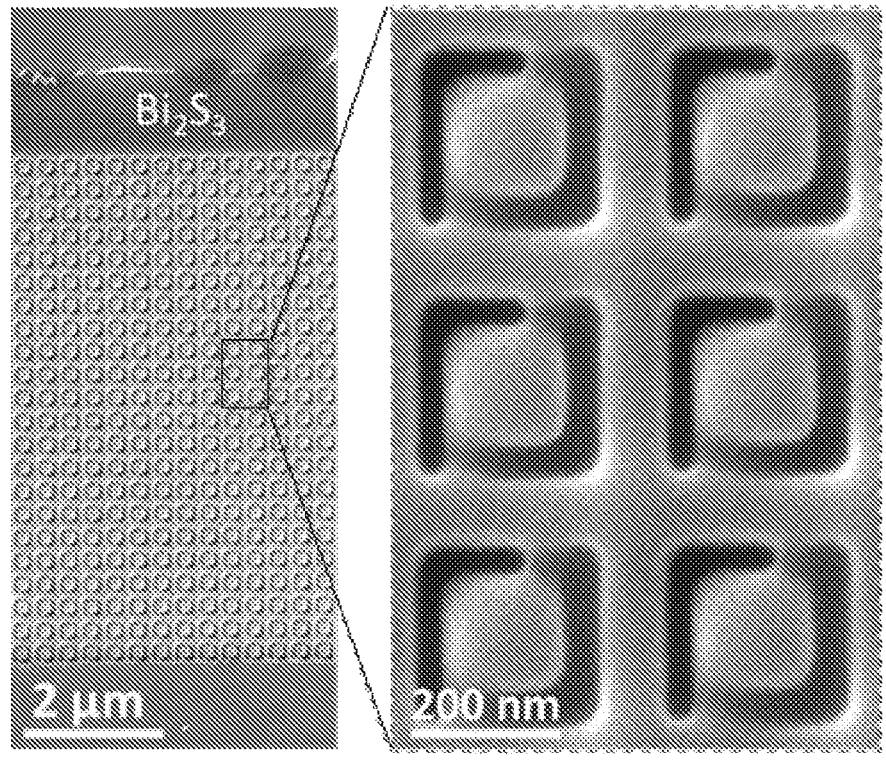
FIG. 21B shows scanning electron microscope images of right chiral metamaterials carved between the Au electrodes on the surface of a $Bi_2S_3$ flake.

FIG. 21A shows a layout and a top microscopy view of a BSTS device and schematic of the device cross-section. FIG. 21B shows scanning electron microscope images of right chiral metamaterials carved between the Au electrodes on the surface of a $Bi_2S_3$ flake.

Figure 22:
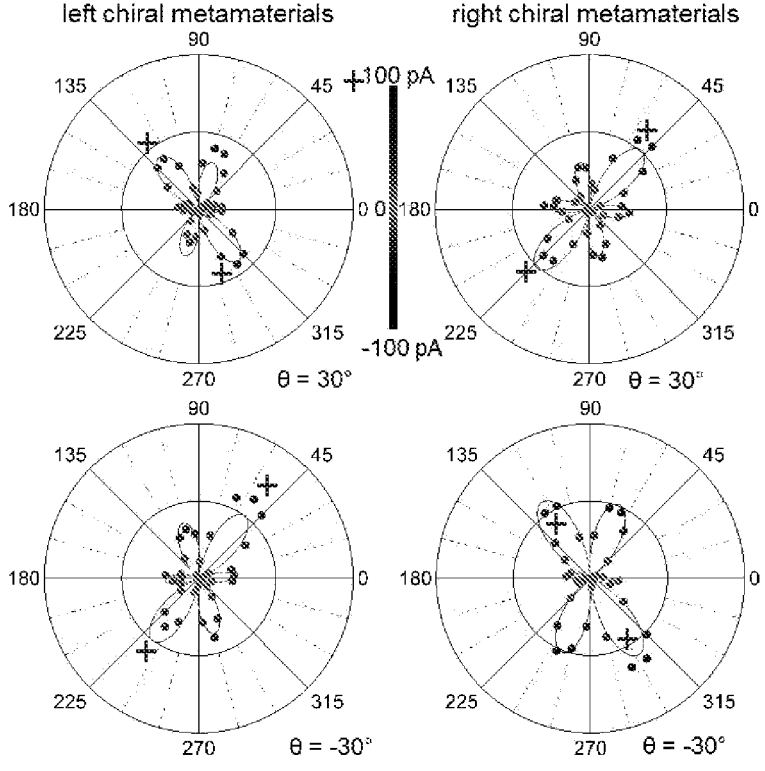
FIG. 22 shows polar plots of HDPC for a BSTS left chiral metamaterial (left column) and BSTS right chiral metamaterial (right column) at 2 different angles of incidence.

FIG. 22 shows polar plots of HDPC for a BSTS left chiral metamaterial (left column) and BSTS right chiral metamaterial (right column) at 2 different angles of incidence, $\theta=30°$ (top row) and $\theta=-30°$ (bottom row); the CPGE are dominant at oblique incidence, with mirror symmetric behavior on the angle of incidence (and geometric chirality of the metamaterial design).

Figure 23:
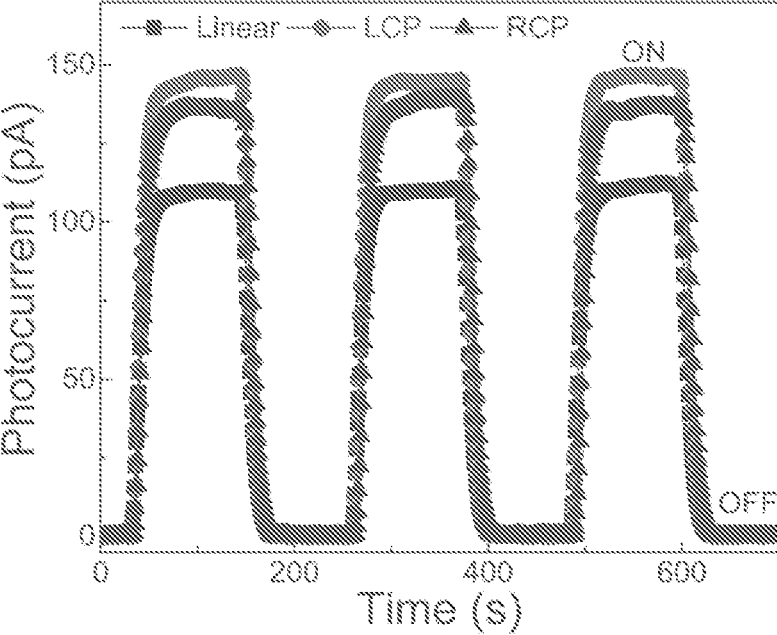
FIG. 23 shows photocurrent measured over time showing the stability of a BSTS flake.

FIG. 23 shows photocurrent measured over time showing the stability of a BSTS flake. Photocurrent of pristine (unstructured) BSTS flake under linearly and circularly polarized excitation at incident angle $\theta=-45°$.

Example 9: Details of the Layer Production

In accordance with various embodiments, the layer may be formed by known methods. In the examples, the layer may be cleaved or exfoliated from a single crystal, e.g., a $Bi_{1.5}Sb_{0.5}Te_{1.8}Se_{1.2}$ crystal. High-quality BSTS single crystals may be grown using modified Bridgeman methods. High-purity (e.g., 99.9999%, or purer) Bi, Sb, Te, and Se with a molar ratio of 1.5:0.5:1.8:1.2 are first thoroughly mixed and then reacted at high temperature (e.g., greater than 900° C., such as 950° C. was used in the examples herein) for one week in an evacuated quartz tube in a box furnace. Then, the quartz tube may be located vertically in a furnace with a temperature gradient. The temperature may then be decreased to room temperature over three weeks, with different cooling speed in different temperature regions. The obtained crystals are easily cleaved revealing a flat and big shiny surface. An as grown single crystal may be, e.g., a cylinder with about 0.7 cm$^2$ (the cross section area)×2 cm (height).

This particular BSTS stoichiometry yields large surface to volume conductivity, so that transport in nanometric thin flakes is surface-dominated. In examples, BSTS flakes were mechanically exfoliated and transferred from the bulk crystals onto a $SiO_2$ (e.g., 85 nm thick)/p-Si substrates. Electrical contacts (chromium (Cr) (e.g., 5 nm thick)/Au (e.g., 50 nm thick)) for photocurrent measurements were created on the devices by conventional methods, e.g, by electron-beam lithography (EBL) and thermal evaporation. Patterns, such as square rings, were carved on the BSTS flake between the contacts, e.g., by focused ion-beam (FIB) milling. All fabrication steps were performed minimizing the exposure of BSTS to the electron and ion beams. SEM images were acquired after photocurrent measurements.

While the disclosure has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

The invention claimed is:

1. A layer comprising a topological insulator, the layer comprising:

an arrangement of a plurality of patterns on a surface of the layer, each pattern of the plurality of patterns comprising at least a non-straight elongated portion, wherein the pattern is configured to generate a photocurrent which is depending on a helicity of circularly polarized optical excitation.

2. The layer of claim 1, wherein the surface is a first main surface extending in first and second directions (D1, D2), the first and second directions (D1, D2) being perpendicular to each other and to a thickness direction (D3) of the layer.

3. The layer of claim 2, wherein each pattern comprises a pattern portion arranged on a second main surface.

4. The layer of claim 1, wherein each pattern comprises a surface recess and wherein a thickness of the pattern is a depth of the surface recess.

5. The layer of claim 1, wherein each pattern comprises a surface protrusion and wherein a thickness of the pattern is a height of the surface protrusion.

6. The layer of claim 1, wherein each pattern comprises a chirality.

7. The layer of claim 6, wherein the chirality is present under an oblique angle.

8. The layer of claim 6, wherein the chirality is present under a normal angle.

9. The layer of claim 1, wherein the pattern comprises or is a square.

10. The layer of claim 1, wherein each pattern is configured to resonantly increase optical absorption at a resonant wavelength compared to a pattern free and otherwise identical layer.

11. The layer of claim 1, wherein an absorption and/or a photocurrent depends on the helicity of circularly polarized optical excitation at an oblique angle.

12. The layer of claim 1, wherein an absorption and/or a photocurrent depends on the helicity of circularly polarized optical excitation at a normal angle.

13. The layer of claim 1, wherein the topological insulator comprises transitional metal chalcogenides.

14. The layer of claim 13, wherein the topological insulator is $Bi_{1.5}Sb_{0.5}Te_{1.8}Se_{1.2}$.

15. The layer of claim 1, wherein the topological insulator comprises Bi, Sb, Te, and Se.

16. An electronic device comprising the layer comprising the topological insulator of claim 1, and further comprising first and second electrodes on the layer, wherein the first and second electrodes are configured to provide electrical connection to the layer.

17. The electronic device of claim 16, wherein the first and second electrodes are disposed apart from each other on the first main surface of the layer.

18. The electronic device of claim 16, wherein the layer is monocrystalline.

19. A method of controlling spin transport in the layer comprising the topological insulator of claim 1, the method comprising:

applying circularly polarized light on the layer; and driving an electronic component with a photocurrent produced in the layer by the circularly polarized light.

\* \* \* \* \*